United States Patent
Sonoda et al.

(10) Patent No.: US 10,529,948 B2
(45) Date of Patent: Jan. 7, 2020

(54) ORGANIC EL DISPLAY DEVICE AND METHOD FOR PRODUCING SAME

(71) Applicant: Sharp Kabushiki Kaisha, Sakai, Osaka (JP)

(72) Inventors: Tohru Sonoda, Sakai (JP); Takashi Ochi, Sakai (JP); Hisao Ochi, Sakai (JP); Tohru Senoo, Sakai (JP); Takeshi Hirase, Sakai (JP); Akihiro Matsui, Sakai (JP); Jumpei Takahashi, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 16/062,700

(22) PCT Filed: Sep. 28, 2016

(86) PCT No.: PCT/JP2016/004385
§ 371 (c)(1),
(2) Date: Jun. 15, 2018

(87) PCT Pub. No.: WO2018/061056
PCT Pub. Date: Apr. 5, 2018

(65) Prior Publication Data
US 2019/0006618 A1    Jan. 3, 2019

(51) Int. Cl.
*H01L 51/52* (2006.01)
*H01L 27/32* (2006.01)
(Continued)

(52) U.S. Cl.
CPC ...... *H01L 51/5246* (2013.01); *H01L 27/3262* (2013.01); *H01L 51/0097* (2013.01);
(Continued)

(58) Field of Classification Search
CPC ............. H01L 51/5246; H01L 27/3248; H01L 27/3262; H01L 51/0097; H01L 51/5253; H05B 33/04
(Continued)

(56) References Cited

U.S. PATENT DOCUMENTS 8,242,490 B2 *   8/2012   Hong ................. H01L 51/5281
                                                                      257/40
8,657,985 B2 *   2/2014   McCormick ........ H01L 51/5253
                                                                      156/230
(Continued)

FOREIGN PATENT DOCUMENTS

JP   2007-73353 A    3/2007
JP   2007-258005 A   10/2007
(Continued)

OTHER PUBLICATIONS

Official Communication issued in International Patent Application No. PCT/JP2016/004385, dated Dec. 27, 2016.

*Primary Examiner* — Ori Nadav
(74) *Attorney, Agent, or Firm* — Keating & Bennett, LLP

(57) ABSTRACT

An organic EL display device includes a base substrate, an organic EL element provided on the base substrate and including a plurality of organic EL layers arranged in a matrix form, a sealing film provided on the organic EL element, and a plurality of sub pixels defined corresponding to the plurality of organic EL layers. The sealing film is provided with a groove formed to run between adjacent ones of the plurality of sub pixels.

15 Claims, 16 Drawing Sheets

(51) Int. Cl.
*H05B 33/04* (2006.01)
*H01L 51/00* (2006.01)

(52) U.S. Cl.
CPC ......... *H01L 51/5253* (2013.01); *H05B 33/04* (2013.01); *H01L 27/3248* (2013.01)

(58) Field of Classification Search
USPC ........................................................... 257/40
See application file for complete search history.

(56) References Cited

U.S. PATENT DOCUMENTS

| | | | |
|---|---|---|---|
| 9,431,633 B2* | 8/2016 | Park | ................ H01L 51/52 |
| 2007/0064193 A1* | 3/2007 | Kurasawa | ........ G02F 1/133371 |
| | | | 349/155 |
| 2008/0116795 A1* | 5/2008 | Tsuchiya | .............. H01L 27/127 |
| | | | 313/512 |
| 2008/0286895 A1* | 11/2008 | Hoshi | ................ H01L 51/5253 |
| | | | 438/33 |
| 2013/0021541 A1* | 1/2013 | Ito | .................... G02F 1/133524 |
| | | | 349/5 |
| 2014/0117842 A1* | 5/2014 | Hanamura | ........... H01L 27/322 |
| | | | 313/504 |
| 2014/0361260 A1* | 12/2014 | Kim | .................... H01L 27/3246 |
| | | | 257/40 |
| 2014/0368106 A1 | 12/2014 | Nozawa | |
| 2015/0282259 A1* | 10/2015 | Yamada | ................ H05B 33/04 |
| | | | 313/512 |
| 2016/0007441 A1 | 1/2016 | Matsueda | |
| 2016/0064690 A1 | 3/2016 | Kook et al. | |
| 2016/0363822 A1* | 12/2016 | Asozu | ............... G02F 1/133371 |
| 2017/0365812 A1* | 12/2017 | Choung | ............. H01L 51/5253 |
| 2018/0031903 A1* | 2/2018 | Nagata | ............. G02F 1/133502 |
| 2019/0006443 A1* | 1/2019 | Hanashima | ......... H01L 27/3246 |

FOREIGN PATENT DOCUMENTS

| | | |
|---|---|---|
| JP | 2013-093289 A | 5/2013 |
| JP | 2015-002134 A | 1/2015 |
| JP | 2016-015618 A | 1/2016 |
| JP | 2016-054144 A | 4/2016 |

* cited by examiner

ORGANIC EL DISPLAY DEVICE AND METHOD FOR PRODUCING SAME

TECHNICAL FIELD

The disclosure relates to an organic EL display device and a method for producing the same.

BACKGROUND ART

In recent years, an organic EL display device of a self light emitting type using an organic electroluminescence (EL) element has attracted attention as a display device that can replace a liquid crystal display device. Here, a typical organic EL display device includes a sealing film provided to cover an organic EL element in order to suppress degradation of the organic EL element due to incorporation of, for example, moisture and oxygen.

For example, PTL 1 discloses a method for producing an organic EL element. In the method, a sealing film is patterned by performing dry etching with use of a metal mask to remove a portion of the sealing film.

CITATION LIST

Patent Literature

PTL 1: JP 2007-73353 A

SUMMARY

Technical Problem

Meanwhile, since an inorganic film constituting at least a portion of a sealing film is fragile, cracking tends to occur in the inorganic film owing to stress applied to the inorganic film. Therefore, when an organic EL display device including a sealing film is bent, cracking may occur in the sealing film owing to bending stress generated at the time of bending the organic EL display device. In this case, since sealing performance of the sealing film decreases, reliability of the organic EL display device decreases.

The disclosure has been made in view of the above. An object of the disclosure is to suppress occurrence of cracking in a sealing film at the time of bending an organic EL display device.

Solution to Problem

To achieve the above-described object, an organic EL display device according to the disclosure includes a base substrate, an organic EL element provided on the base substrate and including a plurality of organic EL layers arranged in a matrix form, a sealing film provided on the organic EL element, and a plurality of sub pixels defined corresponding to the plurality of organic EL layers. In the organic EL display device, the sealing film is provided with a groove formed to run between adjacent ones of the plurality of sub pixels.

Advantageous Effects of Disclosure

Since a sealing film provided on an organic EL element is provided with a groove formed to run between adjacent ones of a plurality of sub pixels, occurrence of cracking in the sealing film at the time of bending an organic EL display device can be suppressed.

DESCRIPTION OF EMBODIMENTS

Embodiments of the disclosure will be described below in detail with reference to the drawings. Note that the disclosure is not limited to the embodiments described below.

First Embodiment

Figure 1:
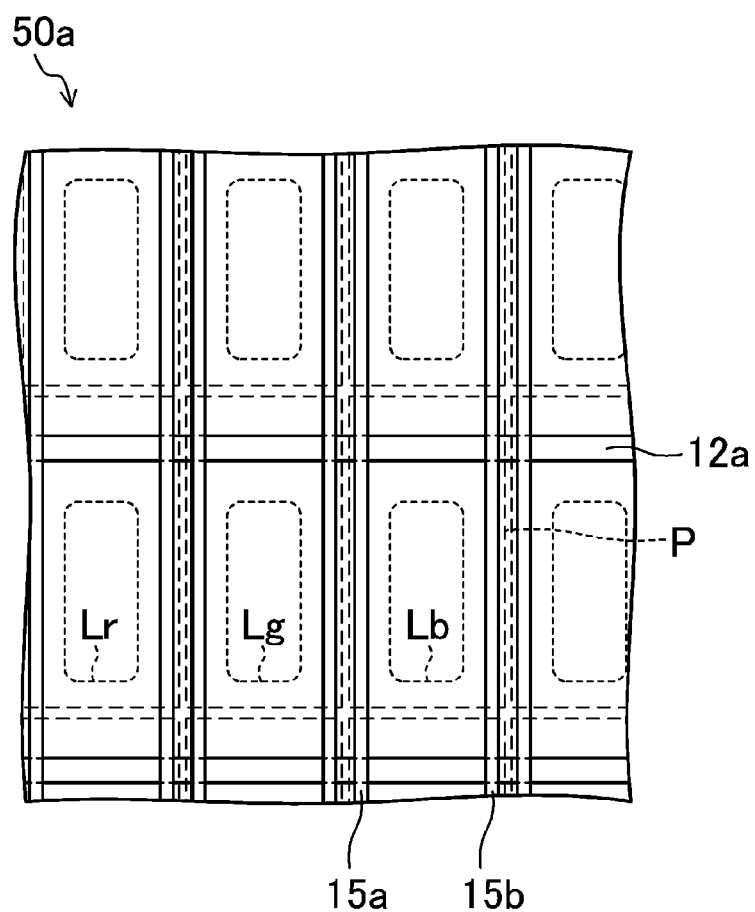
FIG. 1 is a plan view illustrating a pixel structure of an organic EL display device according to a first embodiment of the disclosure.
Figure 2:
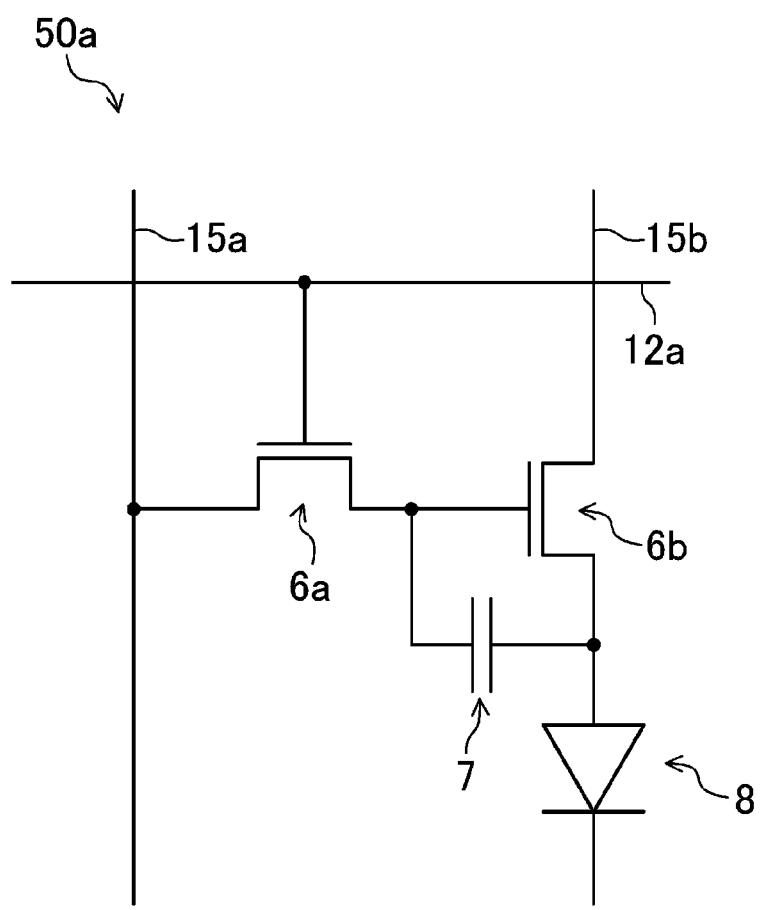
FIG. 2 is an equivalent circuit diagram of sub pixels of the organic EL display device according to the first embodiment of the disclosure.
Figure 3:
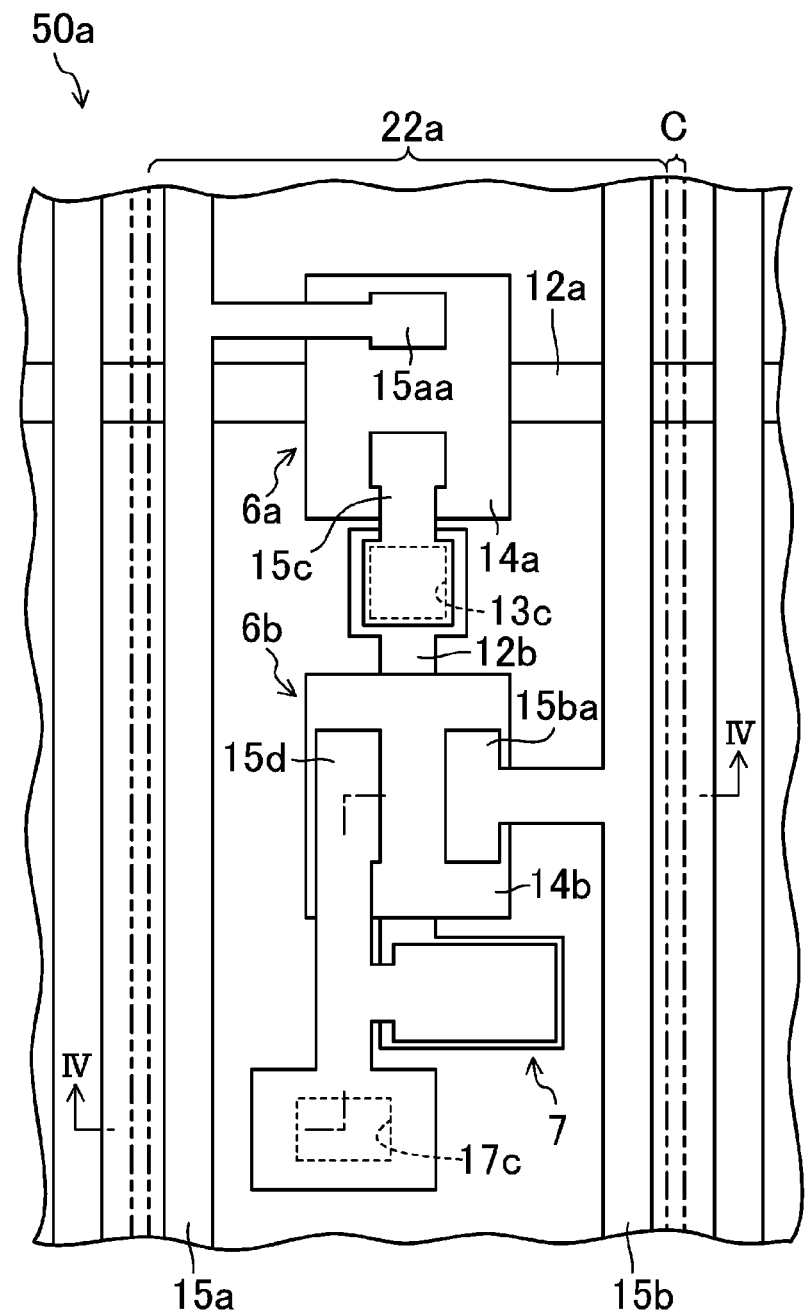
FIG. 3 is a plan view illustrating an internal structure of the sub pixels of the organic EL display device according to the first embodiment of the disclosure.
Figure 4:
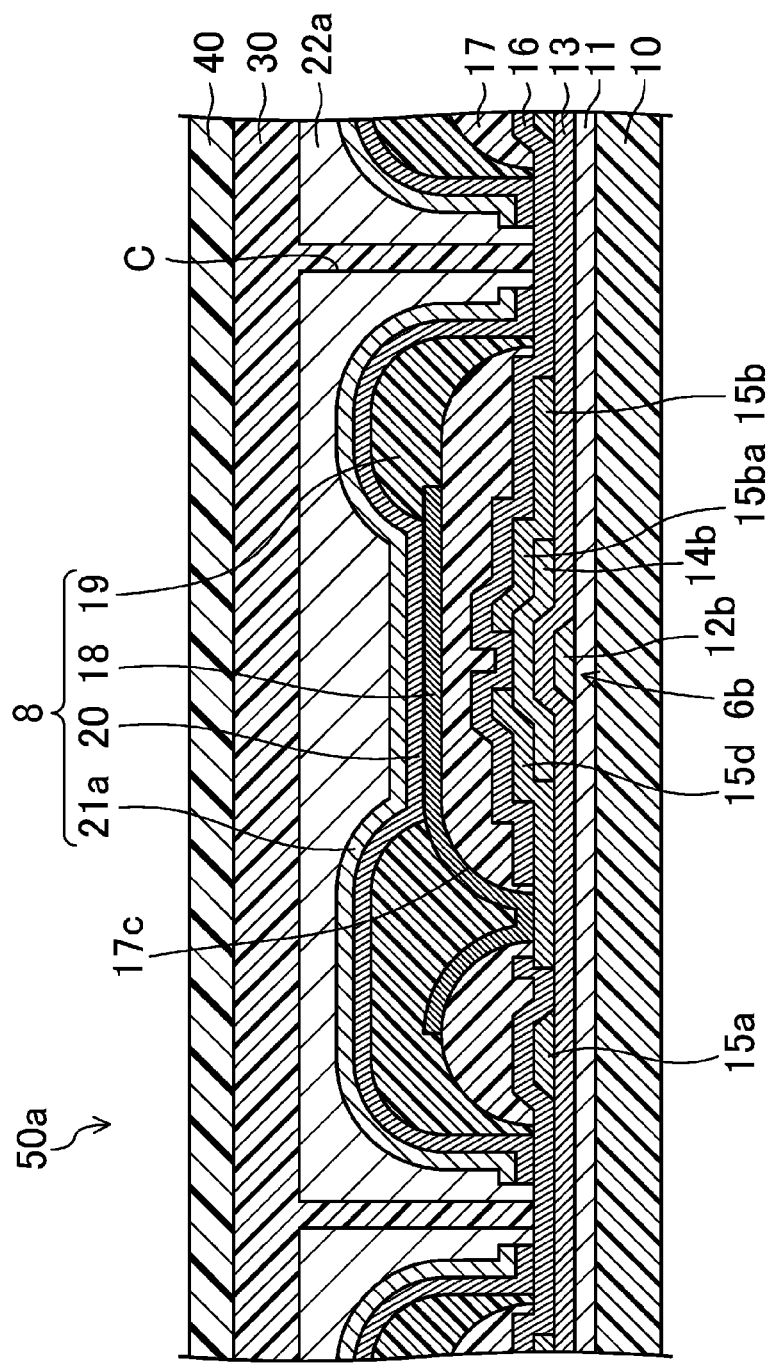
FIG. 4 is a cross-sectional view of the organic EL display device taken along line IV-IV in FIG. 3.
Figure 5:
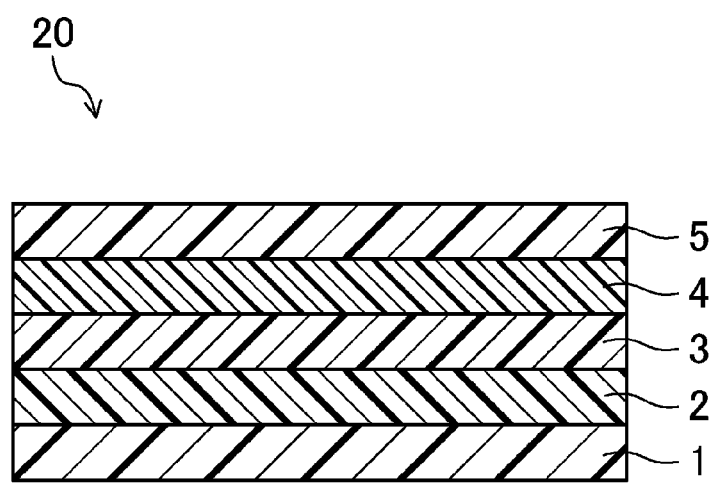
FIG. 5 is a cross-sectional view of an organic EL layer constituting the organic EL display device according to the first embodiment of the disclosure.
Figure 6:
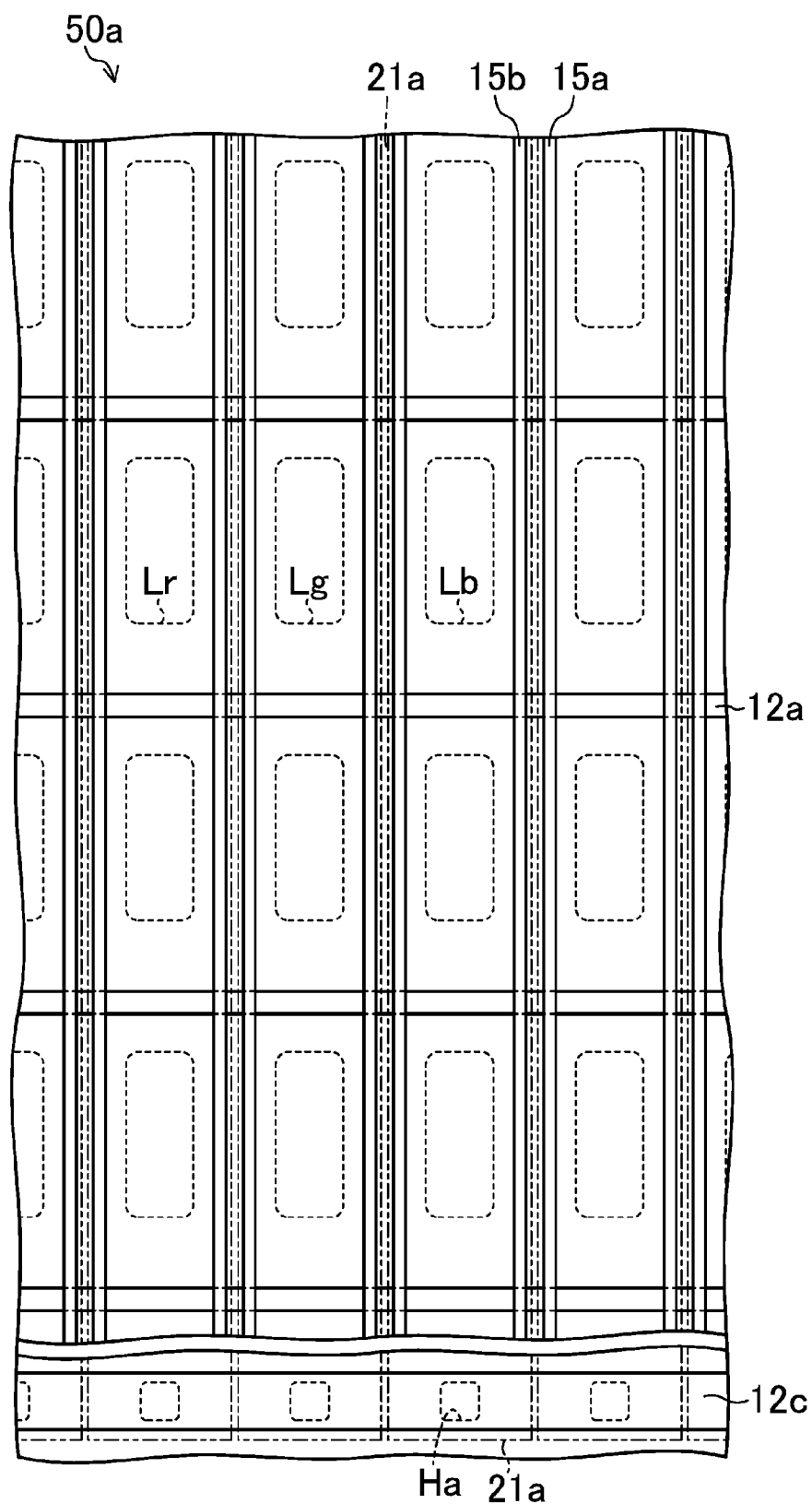
FIG. 6 is a plan view illustrating an arrangement structure for second electrodes in the organic EL display device according to the first embodiment of the disclosure.
Figure 7:
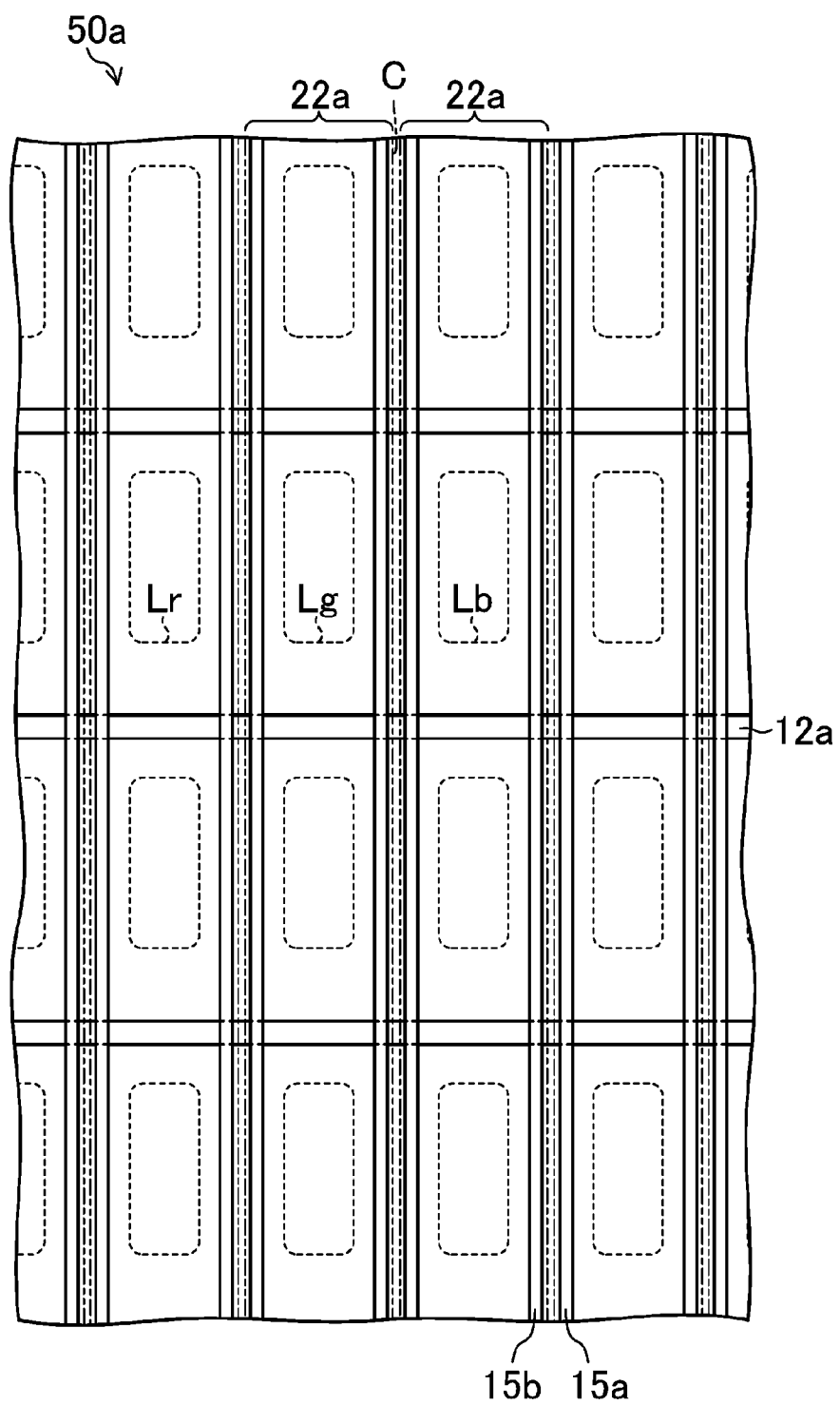
FIG. 7 is a plan view illustrating an arrangement structure for sealing films in the organic EL display device according to the first embodiment of the disclosure.

FIGS. 1 to 7 each illustrate a first embodiment of an organic EL display device according to the disclosure. Here, FIG. 1 is a plan view illustrating a pixel structure of an organic EL display device 50a according to the present embodiment. Moreover, FIG. 2 is an equivalent circuit diagram of sub pixels P of the organic EL display device 50a. Moreover, FIG. 3 is a plan view illustrating an internal structure of the sub pixels P of the organic EL display device 50a. Moreover, FIG. 4 is a cross-sectional view of the organic EL display device 50a taken along line IV-IV in FIG. 3. Moreover, FIG. 5 is a cross-sectional view of an organic EL layer 20 constituting the organic EL display device 50a. Moreover, FIGS. 6 and 7 are plan views respectively illustrating arrangement structures for second electrodes 21a and sealing films 22a in the organic EL display device 50a.

The organic EL display device 50a includes a display region rectangular in plan view. In the display region, the plurality of sub pixels P (see FIG. 1) are arranged in a matrix form. Here, as illustrated in FIG. 1, in the display region of the organic EL display device 50a, a sub pixel P including a red light emitting region Lr for performing gray scale display of red, a sub pixel P including a green light emitting region Lg for performing gray scale display of green, and a sub pixel P including a blue light emitting region Lb for performing gray scale display of blue are provided adjacent to one another. Then, in the display region of the organic EL display device 50a, the three sub pixels P adjacent to one another and respectively including the red light emitting region Lr, the green light emitting region Lg and the blue light emitting region Lb constitute one pixel.

As illustrated in FIG. 4, the organic EL display device 50a includes a base substrate 10, an organic EL element 8 provided on the base substrate 10 via a moisture-proof film 11 described below to interlayer insulating films 17 described below, the plurality of sealing films 22a provided on the organic EL element 8, and a functional layer 40 provided on the plurality of sealing films 22a via an adhesive layer 30.

The base substrate 10 is a plastic substrate including a polyimide resin, for example.

The moisture-proof film 11 is provided on the base substrate 10 and includes, for example, a silicon oxide film, a silicon nitride film, or a silicon oxynitride film. Here, as illustrated in FIGS. 2 and 3, a plurality of gate lines 12a are provided on the moisture-proof film 11 to extend parallel to one another in a lateral direction in FIGS. 2 and 3. Moreover, as illustrated in FIGS. 3 and 4, in each of sub pixels P, a gate electrode 12b of a drive Thin Film Transistor (TFT) 6b described below is provided on the moisture-proof film 11 in a form of an island to extend in a vertical direction in FIG. 3. Further, as illustrated in FIG. 4, a gate insulating film 13 is provided on the moisture-proof film 11 to cover the gate lines 12a and the gate electrodes 12b. Note that the gate line 12a and the gate electrode 12b each include, for example, a metal film including, for example, aluminum, titanium, tungsten, tantalum, copper or an alloy including one or more of these. Moreover, the gate insulating film 13 includes, for example, a silicon oxide film, a silicon nitride film, or a silicon oxynitride film.

As illustrated in FIGS. 3 and 4, in each of the sub pixels P, a first semiconductor layer 14a and a second semiconductor layer 14b are provided on the gate insulating film 13 to overlap the gate line 12a and the gate electrode 12b, respectively. Moreover, as illustrated in FIGS. 3 and 4, a plurality of data lines 15a are provided on the gate insulating film 13 to extend parallel to one another in the vertical direction in FIG. 3. Moreover, as illustrated in FIGS. 3 and 4, a plurality of power source lines 15b are provided on the gate insulating film 13 to extend parallel to one another and to be each adjacent to corresponding one of the data lines 15a. Note that the first semiconductor layer 14a and the second semiconductor layer 14b each include, for example, amorphous silicon, low-temperature poly-silicon or an In—Ga—Zn—O system oxide semiconductor.

As illustrated in FIG. 3, in each of the sub pixels P, a source electrode 15a a is provided on the gate insulating film 13 and the first semiconductor layer 14a to project in the lateral direction in FIG. 3 from corresponding one of the data lines 15a. Moreover, as illustrated in FIG. 3, in each of the sub pixels P, a drain electrode 15c in a form of an island is provided on the gate insulating film 13 and the first semiconductor layer 14a to extend in the vertical direction in FIG. 3. Then, as illustrated in FIG. 3, a portion of the gate line 12a, the gate insulating film 13, the first semiconductor layer 14a, the source electrode 15a a and the drain electrode 15c as described above constitute a switching TFT 6a.

As illustrated in FIGS. 3 and 4, in each of the sub pixels P, a drain electrode 15d in a form of an island is provided on the gate insulating film 13 and the second semiconductor layer 14b to extend in the vertical direction in FIG. 3. Moreover, as illustrated in FIGS. 3 and 4, a source electrode 15b a is provided on the gate insulating film 13 and the second semiconductor layer 14b to project in the lateral direction in FIG. 3 from corresponding one of the power source lines 15b. Then, as illustrated in FIGS. 3 and 4, the gate electrode 12b, the gate insulating film 13, the second semiconductor layer 14b, the source electrode 15b a and the drain electrode 15d as described above constitute the drive TFT 6b. Note that the data line 15a, the source electrode 15a a, the power source line 15b, the source electrode 15b a, the drain electrode 15c and the drain electrode 15d each include, for example, a metal film including, for example, aluminum, titanium, tungsten, tantalum, copper or an alloy including one or more of these. Further, as illustrated in FIG. 4, a passivation film 16 and a plurality of the interlayer insulating films 17 are provided in order on the gate insulating film 13 to cover the switching TFT 6a and the drive TFT 6b except for a connection portion of the drain electrode 15d. Note that the passivation film 16 includes, for example, a silicon oxide film, a silicon nitride film or a silicon oxynitride film. Moreover, the plurality of interlayer insulating films 17 are, for example, provided to extend parallel to one another in the vertical direction in FIG. 3. Moreover, the interlayer insulating films 17 each include, for example, a transparent organic resin material such as an acrylic resin. Here, as illustrated in FIGS. 2 and 3, the drain electrode 15c of the switching TFT 6a is connected to the gate electrode 12b of the drive TFT 6b via a contact hole 13c formed in the gate insulating film 13. Moreover, as illustrated in FIGS. 2 and 3, the gate electrode 12b of the drive TFT 6b, the drain electrode 15d and the gate insulating film 13 disposed between the gate electrode 12b and the drain electrode 15d constitute a capacitor 7. Moreover, as illustrated in FIGS. 2 to 4, the drain electrode 15d of the drive TFT 6b is connected to the organic EL element 8 via a contact hole 17c formed in the interlayer insulating film 17.

As illustrated in FIG. 4, the organic EL element 8 includes a plurality of first electrodes 18, a plurality of edge covers 19, a plurality of the organic EL layers 20 and the plurality of second electrodes 21a, which are provided in order on the interlayer insulating films 17.

The plurality of first electrodes 18 are provided as positive electrodes in the respective sub pixels P and are arranged in a matrix form on the interlayer insulating films 17. Moreover, as illustrated in FIG. 4, in each of the sub pixels P, the first electrode 18 is connected to the drain electrode 15d of the drive TFT 6b via the contact hole 17c formed in the interlayer insulating film 17. Moreover, the first electrode 18 functions to inject holes into the organic EL layer 20. Moreover, the first electrode 18 is more preferably formed with a material having a large work function to improve hole injection efficiency into the organic EL layer 20. Here, examples of the material constituting the first electrode 18 include metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li) and ytterbium (Yb). Moreover, an example of the material constituting the first electrode 18 may include an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al) or lithium fluoride (LiF)/calcium (Ca)/aluminum (Al). Further, an example of the material constituting the first electrode 18 may include an electrically conductive oxide such as tin oxide (SnO), zinc oxide (ZnO), Indium Tin Oxide (ITO) and Indium Zinc Oxide (IZO). Moreover, the first electrode 18 may be formed by layering a plurality of the layers including the above-described materials such as ITO/Ag, IZO/Ag and IZO/Al. Note that examples of the material having a large work function among materials such as electrically conductive oxides include Indium Tin Oxide (ITO) and Indium Zinc Oxide (IZO).

The plurality of edge covers 19 are, for example, provided to extend parallel to one another in the vertical direction in FIG. 3. Moreover, as illustrated in FIG. 4, the edge covers 19 is provided in a ladder shape to cover end edges of the first electrodes 18 of all the sub pixels P arranged in corresponding one of rows in the vertical direction in FIG. 3. Here, an example of a material constituting the edge cover 19 includes an inorganic film such as silicon oxide ($SiO_2$), silicon nitride (SiNx (x is a positive number)) such as trisilicon tetranitride ($Si_3N_4$) and silicon oxynitride (SiON), or an organic film such as a (photosensitive) polyimide resin, a (photosensitive) acrylic resin, a (photosensitive) polysiloxane resin and a novolak resin.

The plurality of organic EL layers 20 are provided in the respective sub pixels P and are arranged in a matrix form on the first electrodes 18 and the edge covers 19. Moreover, in each of the sub pixels P, the organic EL layer 20 is provided to cover portions of the first electrode 18 that are exposed out of the edge cover 19. Here, as illustrated in FIG. 5, the organic EL layer 20 includes a hole injecting layer 1, a hole transport layer 2, a light emitting layer 3, an electron transport layer 4 and an electron injecting layer 5, which are provided in order on the first electrode 18.

The hole injecting layer 1 is also referred to as a positive electrode buffer layer, and functions to reduce an energy level difference between the first electrode 18 and the organic EL layer 20, and to improve hole injection efficiency from the first electrode 18 into the organic EL layer 20. Here, examples of a material constituting the hole injecting layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative and a stilbene derivative.

The hole transport layer 2 functions to improve hole transport efficiency from the first electrode 18 to the organic EL layer 20. Here, examples of a material constituting the hole transport layer 2 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide and zinc selenide.

The light emitting layer 3 is a region where, when a voltage is applied by the first electrode 18 and the second electrode 21a described blow, holes and electrons are injected from the first electrode 18 and the second electrode 21a, respectively, and the holes and the electrons recombine. Here, the light emitting layer 3 is formed with a material having high light emitting efficiency. Then, examples of the material constituting the light emitting layer 3 include a metal oxinoid compound (8-hydroxyquinoline metal complex), a naphthalene derivative, an anthracene derivative, a diphenyl ethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a trisstyrylbenzene derivative, a perylene derivative, a perinone derivative, an aminopyrene derivative, a pyridine derivative, a rhodamine derivative, an aquidine derivative, phenoxazone, a quinacridone derivative, rubrene, poly-p-phenylenevinylene and polysilane.

The electron transport layer 4 functions to cause electrons to migrate to the light emitting layer 3 efficiently. Here, examples of a material constituting the electron transport layer 4 include an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative and a metal oxinoid compound.

The electron injecting layer 5 functions to reduce an energy level difference between the second electrode 21a and the organic EL layer 20, and to improve efficiency of electron injection from the second electrode 21a into the organic EL layer 20. Owing to this function, a driving voltage for the organic EL element 20 can be reduced. Note that the electron injecting layer 5 is also referred to as a negative electrode buffer layer. Here, examples of a material constituting the electron injecting layer 5 include an inorganic alkaline compound such as lithium fluoride (LiF), magnesium fluoride ($MgF_2$), calcium fluoride ($CaF_2$), strontium fluoride ($SrF_2$) and barium fluoride ($BaF_2$), aluminum oxide ($Al_2O_3$) and strontium oxide (SrO).

As illustrated in FIG. 6, the plurality of second electrodes 21a are provided to extend parallel to one another in a vertical direction in FIG. 6. Moreover, as illustrated in FIG. 6, the second electrodes 21a are each provided in an elongated rectangular shape in plan view to overlap the organic EL layers 20 of all the sub pixels P arranged in corresponding one of rows in the vertical direction in FIG. 6. That is, the second electrodes 21a each electrically connect the sub pixels P arranged in corresponding one of the rows in the vertical direction in FIG. 6 and configured to perform gray scale display of the same color together. Moreover, the second electrodes 21a do not electrically connect the sub pixels P arranged adjacent to one another in a lateral direction in FIG. 6 and configured to perform gray scale display of different colors together. Moreover, as illustrated in FIG. 6, in a non-display region, the second electrodes 21a are connected via a contact hole Ha formed in a layered film of the gate insulating film 13 and of the passivation film 16 to a common wiring line 12c including the same material as the gate line 12a and provided in the same layer as the gate line 12a. Here, the second electrode 21a functions to inject electrons into the organic EL layer 20. Moreover, the second electrode 21a more preferably include a material having a small work function to improve electron injection efficiency into the organic EL layer 20. Note that examples of the material constituting the second electrode 21a include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li) and ytterbium (Yb). Moreover, an example of the material constituting the second electrode 21a may include an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al) and lithium fluoride (LiF)/calcium (Ca)/aluminum (Al). Moreover, an example of the material constituting the second electrode 21a may include electrically conductive oxide such as tin oxide (SnO), zinc oxide (ZnO), Indium Tin Oxide (ITO) and Indium Zinc Oxide (IZO). Moreover, the second electrode 21a may be formed by layering a plurality of layers including the above-described materials such as ITO/Ag. Note that examples of the material having a small work function include magnesium (Mg), lithium (Li), magnesium (Mg)/copper (Cu), magnesium (Mg)/silver (Ag), sodium (Na)/potassium (K), lithium (Li)/aluminum (Al), lithium (Li)/calcium (Ca)/aluminum (Al) and lithium fluoride (LiF)/calcium (Ca)/aluminum (Al).

As illustrated in FIG. 7, the plurality of sealing films 22a are provided to extend parallel to one another in a vertical direction in FIG. 7. Moreover, as illustrated in FIGS. 4 and 7, the sealing films 22a are provided on the second electrodes 21a, and are each formed in an elongated rectangular shape in plan view to cover edge surfaces of the organic EL layers 20 of all the sub pixels P arranged in corresponding one of rows in the vertical direction in FIG. 7. Moreover, as illustrated in FIGS. 4 and 7, the plurality of sealing films 22a are provided with grooves C each formed to extend in the vertical direction in FIG. 7 and to run between adjacent ones of the sub pixels P. Moreover, the sealing films 22a function to protect the organic EL layers 20 from, for example, moisture and oxygen. Here, for example, the sealing films 22a each include a monolayer film of an inorganic material such as a silicon oxide film, a silicon nitride film and a silicon oxynitride film, or include a layered film of two or more of these films. Note that the present embodiment describes the example in which the sealing films 22a each include at least one inorganic film, but the sealing films 22a may each include a layered film of the at least one inorganic film and of an organic film including, for example, acrylate, polyurea, parylene, polyimide or polyamide.

The adhesive layer 30 may include, for example, a UV-curable adhesive, a thermosetting adhesive, an epoxy adhesive, an acrylic adhesive or a polyolefin adhesive.

The functional layer 40 includes, for example, a hard coat film, a phase difference plate or a polarizing plate.

When the organic EL display device 50a including the above-described configuration displays an image, in each of the sub pixels P, a gate signal is input to the switching TFT 6a via the gate line 12a, and as a result, the switching TFT 6a is turned on. In this case, in each of the sub pixels P of the organic EL display device 50a, a predetermined voltage corresponding to a source signal is written to the gate electrode 12b of the drive TFT 6b via the data line 15a. Further, in each of the sub pixels P of the organic EL display device 50a, based on the voltage of the gate electrode 12b of the drive TFT 6b, a magnitude of electrical current from the power source line 15b is defined, and the electrical current is supplied to the light emitting layer 3 of the organic EL element 8. As a result, the light emitting layer 3 emits light. Here, in the organic EL display device 50a, even when the switching TFT 6a is turned off, since the voltage of the gate electrode 12b of the drive TFT 6b is held by the capacitor 7, the light emission by the light emitting layer 3 is maintained until a gate signal of the next frame is input.

The organic EL display device 50a of the present embodiment can be produced in the following manner, for example.

First, for example, the moisture-proof layer 11, TFT arrays such as the switching TFT 6a and the drive TFT 6b, the passivation film 16 and the interlayer insulating films 17 are formed by using a known method on a surface of the base substrate 10 formed on a glass substrate.

Subsequently, the first electrodes 18, the edge covers 19, the organic EL layers 20 and the second electrodes 21a are formed in order by using a known method on the interlayer insulating films 17. Thus, the organic EL element 8 is formed.

Further, an inorganic layered film serving as the sealing films 22a and a photoresist are formed by using a known method on the second electrodes 21a. Subsequently, portions of the inorganic film that are exposed out of the photoresist are etched with a buffered hydrofluoric acid to form the sealing films 22a.

Lastly, after the functional layer 40 is applied onto the sealing films 22a via the adhesive layer 30, laser beam irradiation is performed to release the base substrate 10 from the glass substrate.

As described above, according to the organic EL display device 50a of the present embodiment, the following effect can be obtained.

(1) Since the sealing films 22a are provided with the grooves C formed to run between adjacent ones of the plurality of sub pixels P, rigidity of the organic EL display device 50a relatively deceases in portions which are located between adjacent ones of the plurality of sub pixels P and in which the grooves C are formed. Therefore, when the organic EL display device 50a is bent about a bending axis parallel to the data line 15a, in the organic EL display device 50a, a large bending strain is generated in portions which are located outside of the sub pixels P and in which the grooves C are formed, and a small bending strain is generated in portions which are located inside of the sub pixels P and in which no groove C is formed. That is, the bending strain is generated at the time of bending at a constant amount ε defined in accordance with a distance from a neutral plane (plane that does not expand or contract) and a bend radius. However, when there are a low-rigidity portion and a high-rigidity portion at the same distance from the neutral plane, a strain ($\varepsilon_1$) in the low-rigidity portion increases and a strain ($\varepsilon_2$) in the high-rigidity portion reduces. Here, $\varepsilon = \varepsilon_1 + \varepsilon_2$, with the total strain E being constant. Therefore, when there are no low-rigidity portion ($\varepsilon_1 = 0$), $\varepsilon_2 = \varepsilon$ holds, and when there is the low-rigidity portion, the strain ($\varepsilon_2$) in the high-rigidity portion results in $\varepsilon_2 = \varepsilon - \varepsilon_1$ and further reduces. As a result, since a strain in the sealing films 22a reduces, occurrence of cracking can be suppressed in the sealing films 22a. Accordingly, occurrence of cracking in the sealing films 22a at the time of bending the organic EL display device 50a can be suppressed. Further, since occurrence of cracking in the sealing films 22a can be suppressed, sealing performance of the sealing films 22a improves, and reliability of the organic EL display device 50a can be improved.

Second Embodiment

Figure 8:
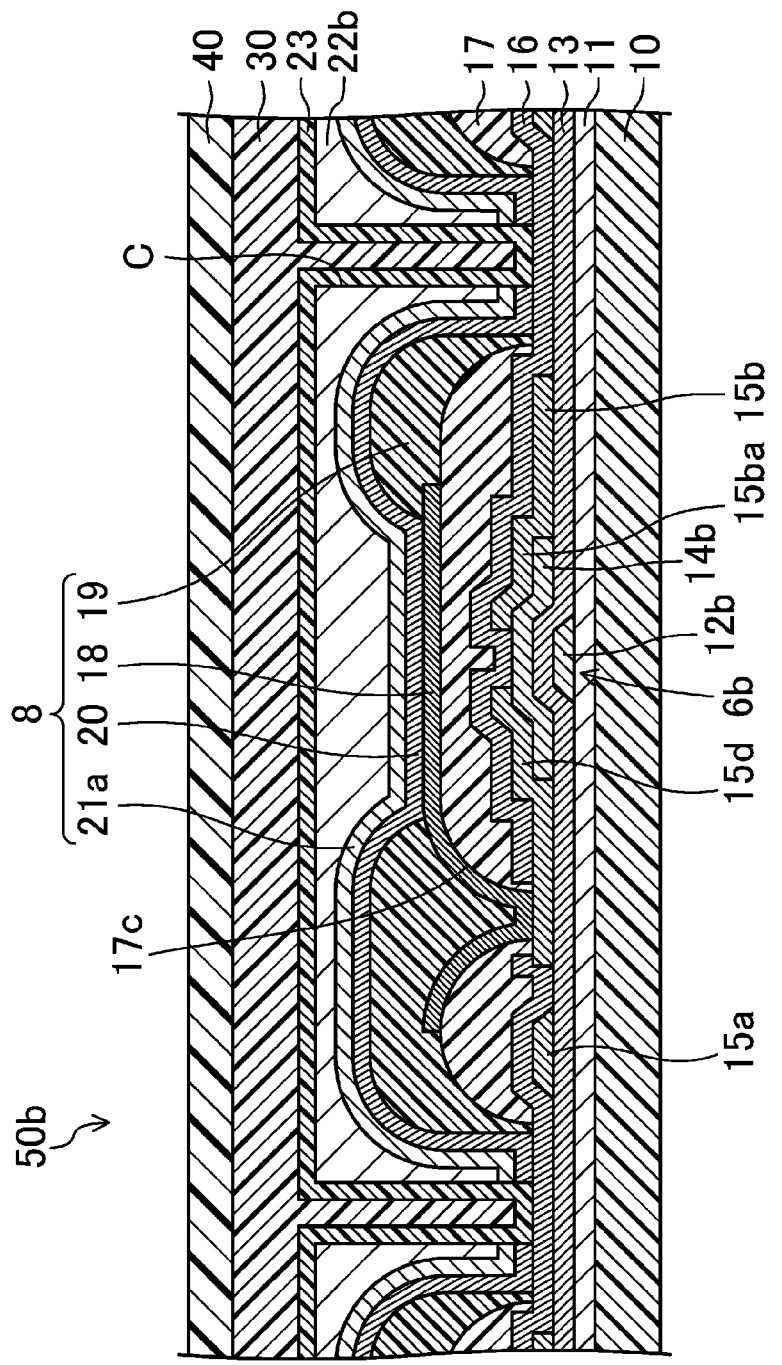
FIG. 8 is a cross-sectional view of an organic EL display device according to a second embodiment of the disclosure, and corresponds to FIG. 4.

FIG. 8 illustrates a second embodiment of an organic EL display device according to the disclosure. Here, FIG. 8 is a cross-sectional view of an organic EL display device 50b of the present embodiment, and corresponds to FIG. 4. Note that in the following embodiments, portions identical to those in FIGS. 1 to 7 are designated by the same reference signs, and detailed description of these portions will be omitted.

The first embodiment describes the example in which the organic EL display device 50a includes the edge surfaces of the organic EL layers 20 covered with the sealing films 22a. On the other hand, the present embodiment describes an example in which an organic EL display device 50b includes edge surfaces of organic EL layers 20 covered with an inorganic barrier film 23.

As illustrated in FIG. 8, the organic EL display device 50b includes a base substrate 10, an organic EL element 8 provided on the base substrate 10 via a moisture-proof film 11 to interlayer insulating films 17, a plurality of sealing films 22b provided on the organic EL element 8, the inorganic barrier film 23 provided to cover the sealing films 22b, and a functional layer 40 provided on the inorganic barrier film 23 via an adhesive layer 30.

As with the sealing films 22a of the first embodiment, the plurality of sealing films 22b are provided to extend parallel to one another. Moreover, as illustrated in FIG. 8, the sealing films 22b are provided on second electrodes 21a, and are each provided in an elongated rectangular shape in plan view to overlap the second electrodes 21a. Moreover, as illustrated in FIG. 8, the plurality of sealing films 22b are provided with grooves C each formed to run between adjacent ones of the sub pixels P. Here, for example, the sealing films 22b each include a monolayer film of an inorganic material such as a silicon oxide film, a silicon nitride film and a silicon oxynitride film, or include a layered film of two or more of these films.

As illustrated in FIG. 8, the inorganic barrier film 23 is in contact with a perimeter edge surface of each of the organic EL layers 20 and a perimeter edge surface of each of the sealing films 22b. Moreover, the inorganic barrier film 23 is formed with, for example, an aluminum oxide film formed by Atomic Layer Deposition (ALD). Note that the atomic layer deposition is a film formation method in which a reaction product is deposited layer by layer at an atomic layer level by repeating a cycle including causing molecules (precursors) of a film formation material to be adsorbed and reacted on a surface of a substrate placed in a vacuum chamber, and subsequently removing excess molecules by purging with an inert gas. Then, the films formed by the atomic layer deposition are very thin (approximately 10 nm) and uniform, and have high coatability.

As with the organic EL display device 50a of the first embodiment, in the organic EL display device 50b including the above-described configuration is configured to display an image by appropriately causing a light emitting layer 3 of the organic EL layer 20 to emit light in each of sub pixels P.

The organic EL display device 50b of the present embodiment can be produced by modifying a portion of the production method described in the first embodiment. Specifically, an electrically conductive film serving as the second electrodes 21a and an inorganic film serving as the sealing films 22b are formed entirely on a substrate on which the organic EL layers 20 are formed. Subsequently, the electrically conductive film and the inorganic film are patterned by etching with a buffered hydrofluoric acid to form the second electrodes 21a and the sealing films 22b. Further, the inorganic barrier film 23 is formed by ALD to cover the sealing films 22b, and subsequently, as with the production method described in the first embodiment, a step of applying the functional layer 40 via the adhesive layer 30 and subsequent steps are performed.

As described above, according to the organic EL display device 50b of the present embodiment, the above-described effect (1) and the following effect (2) can be obtained.

The effect (1) is as follow in detail. Since the sealing films 22b are provided with the grooves C each formed to run between adjacent ones of the plurality of sub pixels P, rigidity of the organic EL display device 50b relatively decreases in portions which are located between adjacent ones of the plurality of sub pixels P and in which the grooves C are formed. Therefore, when the organic EL display device 50b is bent about a bending axis parallel to a data line 15a, in the organic EL display device 50b, a large bending strain is generated in portions which are located outside of the sub pixels P and in which the grooves C are formed, and a small bending strain is generated in portions which are located inside of the sub pixels P and in which no groove C is formed. As a result, since a strain in the sealing films 22b reduces, occurrence of cracking can be suppressed in the sealing films 22b. Accordingly, occurrence of cracking in the sealing films 22b at the time of bending the organic EL display device 50b can be suppressed. Further, since occurrence of cracking in the sealing films 22b can be suppressed, reliability of the organic EL display device 50b can be improved.

(2) Even when the perimeter edge surface of each of the sealing films 22b is at least partially flush with the perimeter edge surfaces of corresponding ones of the organic EL layers 20, since the inorganic barrier film 23 is provided to cover the sealing films 22b, degradation of the organic EL element 8 can be prevented. Moreover, since the inorganic barrier film 23 is thinner and has higher coatability than the sealing films 22b, the inorganic barrier film 23 can suppress a decrease in sealing performance and improve flexibility of the organic EL display device 50b.

Third Embodiment

Figure 9:
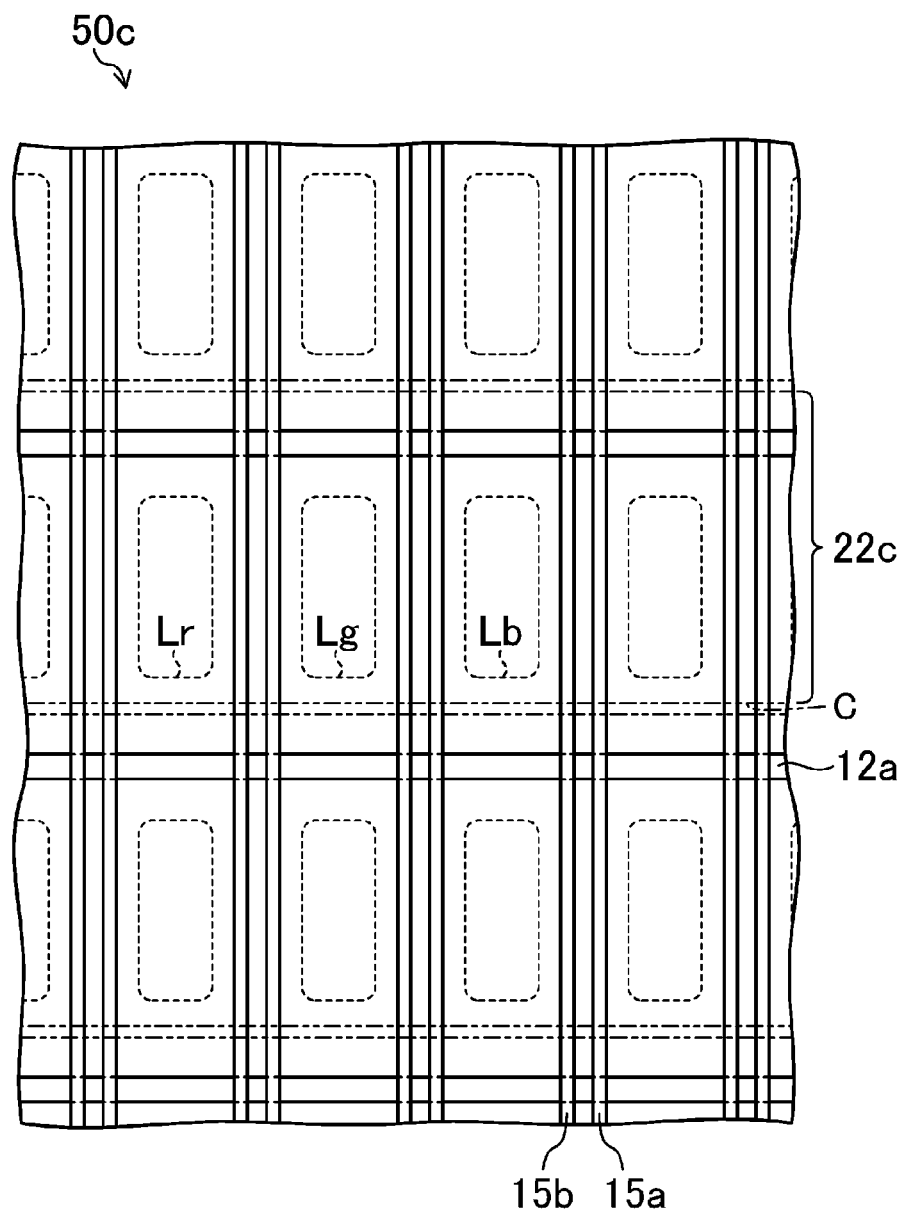
FIG. 9 is a plan view illustrating an arrangement structure for sealing films in an organic EL display device according to a third embodiment of the disclosure.
Figure 10:
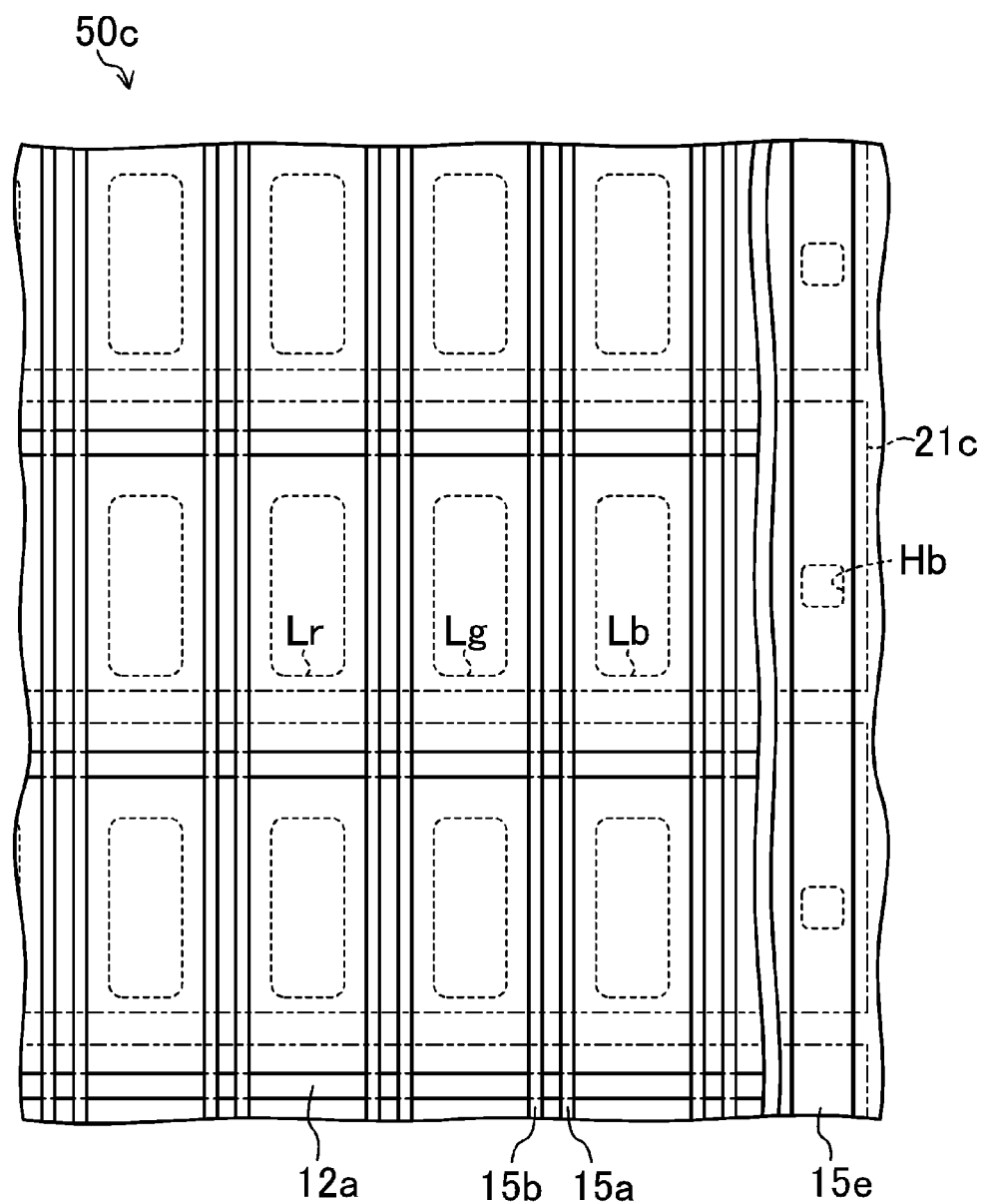
FIG. 10 is a plan view illustrating an arrangement structure for second electrodes in the organic EL display device according to the third embodiment of the disclosure.

FIGS. 9 and 10 each illustrate a third embodiment of an organic EL display device according to the disclosure. Here, FIG. 9 is a plan view illustrating an arrangement structure for sealing films 22c in an organic EL display device 50c of the present embodiment. Moreover, FIG. 10 is a plan view illustrating an arrangement structure for second electrodes 21c in the organic EL display device 50c.

The first and second embodiments describe the examples in which the organic EL display devices 50a and 50b include the sealing films 22a and 22b provided to extend parallel to the data lines 15a, respectively. On the other hand, the present embodiment describes an example in which the organic EL display device 50c includes the sealing films 22c provided to extend parallel to gate lines 12a.

The organic EL display device 50c includes a base substrate 10, an organic EL element 8 provided on the base substrate 10 via a moisture-proof film 11 to interlayer insulating films 17, the plurality of sealing films 22c provided on the organic EL element 8, and a functional layer 40 provided on the plurality of sealing films 22c via an adhesive layer 30.

The organic EL element 8 includes a plurality of first electrodes 18, a plurality of edge covers 19, a plurality of organic EL layers 20 and the plurality of second electrodes 21c, which are provided in order on the interlayer insulating films 17. Here, as illustrated in FIG. 10, the plurality of second electrodes 21c are provided to extend parallel to one another in a lateral direction in FIG. 10. Moreover, as illustrated in FIG. 10, the second electrodes 21c are each provided in an elongated rectangular shape in plan view to overlap the organic EL layers 20 of all sub pixels P arranged in corresponding one of rows in the lateral direction in FIG. 10. That is, the second electrodes 21c each electrically connect the sub pixels P arranged in corresponding one of the rows in the lateral direction in FIG. 10 and configured to perform gray scale display of different colors together. Moreover, the second electrodes 21c do not electrically connect the sub pixels P arranged adjacent to one another in a lateral direction in FIG. 10 and configured to perform gray scale display of the same color together. Moreover, as illustrated in FIG. 10, in a non-display region, the second electrodes 21c are connected via a contact hole Hb formed in a passivation film 16 to a common wiring line 15e including the same material as the data line 15a and provided in the same layer as the data line 15a. Here, the second electrode 21c functions to inject electrons into the organic EL layer 20, and includes the same material as the second electrode 21a described in the first embodiment.

As illustrated in FIG. 9, the plurality of sealing films 22c are provided to extend parallel to one another in a lateral direction in FIG. 9. Moreover, the sealing films 22c are provided on the second electrodes 21c, and are each formed in an elongated rectangular shape in plan view to cover edge surfaces of the organic EL layers 20 of all the sub pixels P in corresponding one of rows in the lateral direction in FIG. 9. Moreover, as illustrated in FIG. 9, the plurality of sealing films 22c are provided with grooves C each formed to extend in the lateral direction in FIG. 9 and to run between adjacent ones of the sub pixels P. Moreover, the sealing films 22c function to protect the organic EL layers 20 from, for example, moisture and oxygen. Here, for example, the sealing films 22c each include a monolayer film of an inorganic material such as a silicon oxide film, a silicon nitride film and a silicon oxynitride film, or include a layered film of two or more of these films.

As with the organic EL display device 50a of the first embodiment, the organic EL display device 50c including the above-described configuration is configured to display an image by appropriately causing a light emitting layer 3 of the organic EL layer 20 to emit light in each of the sub pixels P.

The organic EL display device 50c of the present embodiment can be produced by the production method described in the first embodiment except that the pattern shapes used for forming the second electrodes 21a and the sealing films 22a are modified to form the second electrodes 21c and the sealing films 22c.

As described above, according to the organic EL display device 50c of the present embodiment, the above-described effect (1) can be obtained.

The effect (1) is as follow in detail. Since the sealing films 22c are provided with the grooves C each formed to run between adjacent ones of the plurality of sub pixels P, rigidity of the organic EL display device 50c relatively decreases in portions which are located between adjacent ones of the plurality of sub pixels P and in which the grooves C are formed. Therefore, when the organic EL display device 50c is bent about a bending axis parallel to the gate line 12a, in the organic EL display device 50c, a large bending strain is generated in portions which are located outside of the sub pixels P and in which the grooves C are formed, and a small bending strain is generated in portions which are located inside of the sub pixels P and in which no groove C is formed. As a result, since a strain in the sealing films 22c reduces, occurrence of cracking can be suppressed in the sealing films 22c. Accordingly, occurrence of cracking in the sealing films 22c at the time of bending the organic EL display device 50c can be suppressed. Further, since occurrence of cracking in the sealing films 22c can be suppressed, sealing performance of the sealing films 22c improves, and reliability of the organic EL display device 50c can be improved.

Fourth Embodiment

Figure 11:
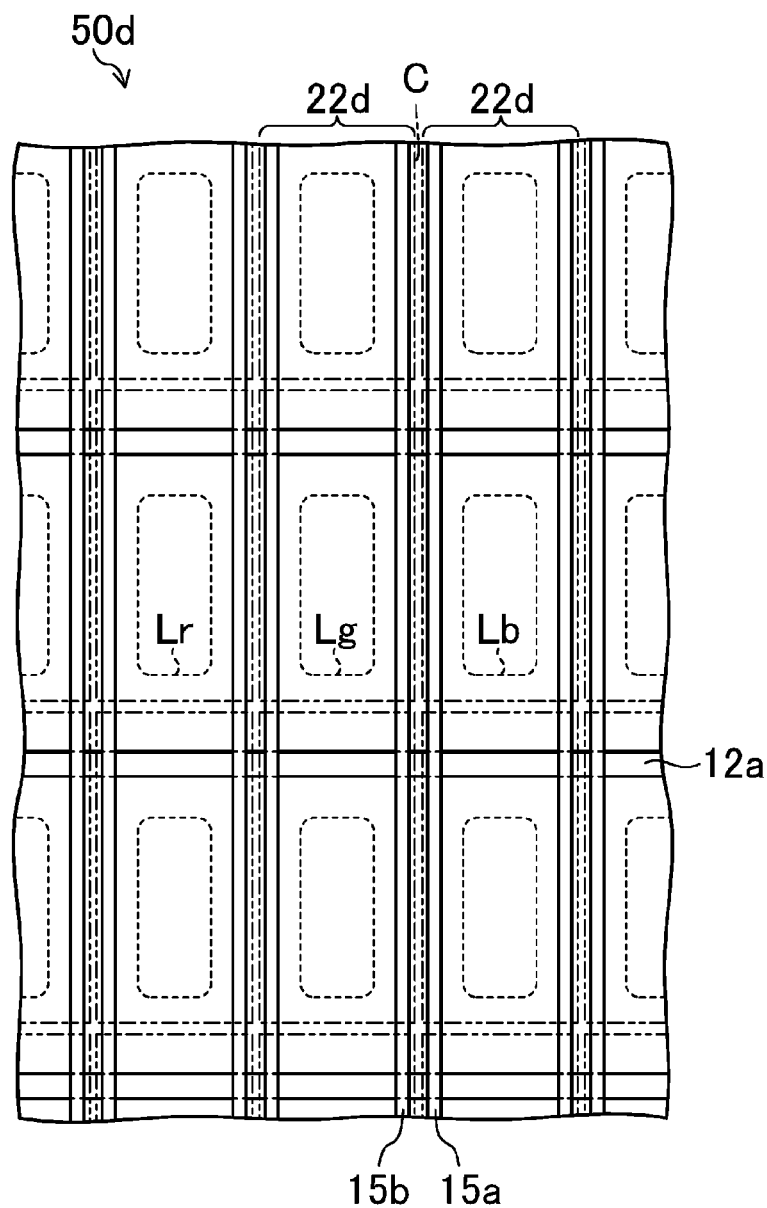
FIG. 11 is a plan view illustrating an arrangement structure for sealing films in an organic EL display device according to a fourth embodiment of the disclosure.
Figure 12:
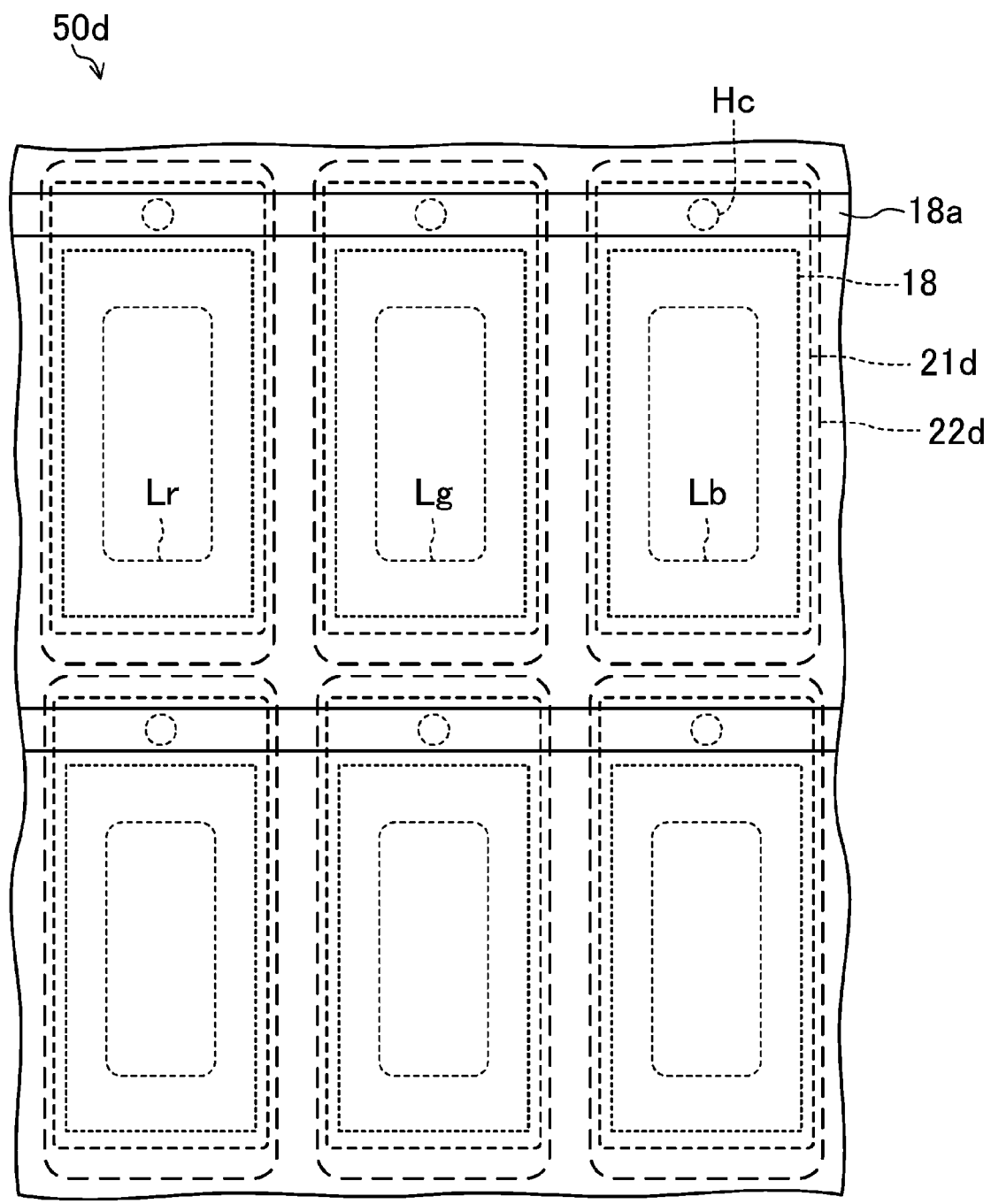
FIG. 12 is a plan view illustrating a connection structure for second electrodes in the organic EL display device according to the fourth embodiment of the disclosure.
Figure 13:
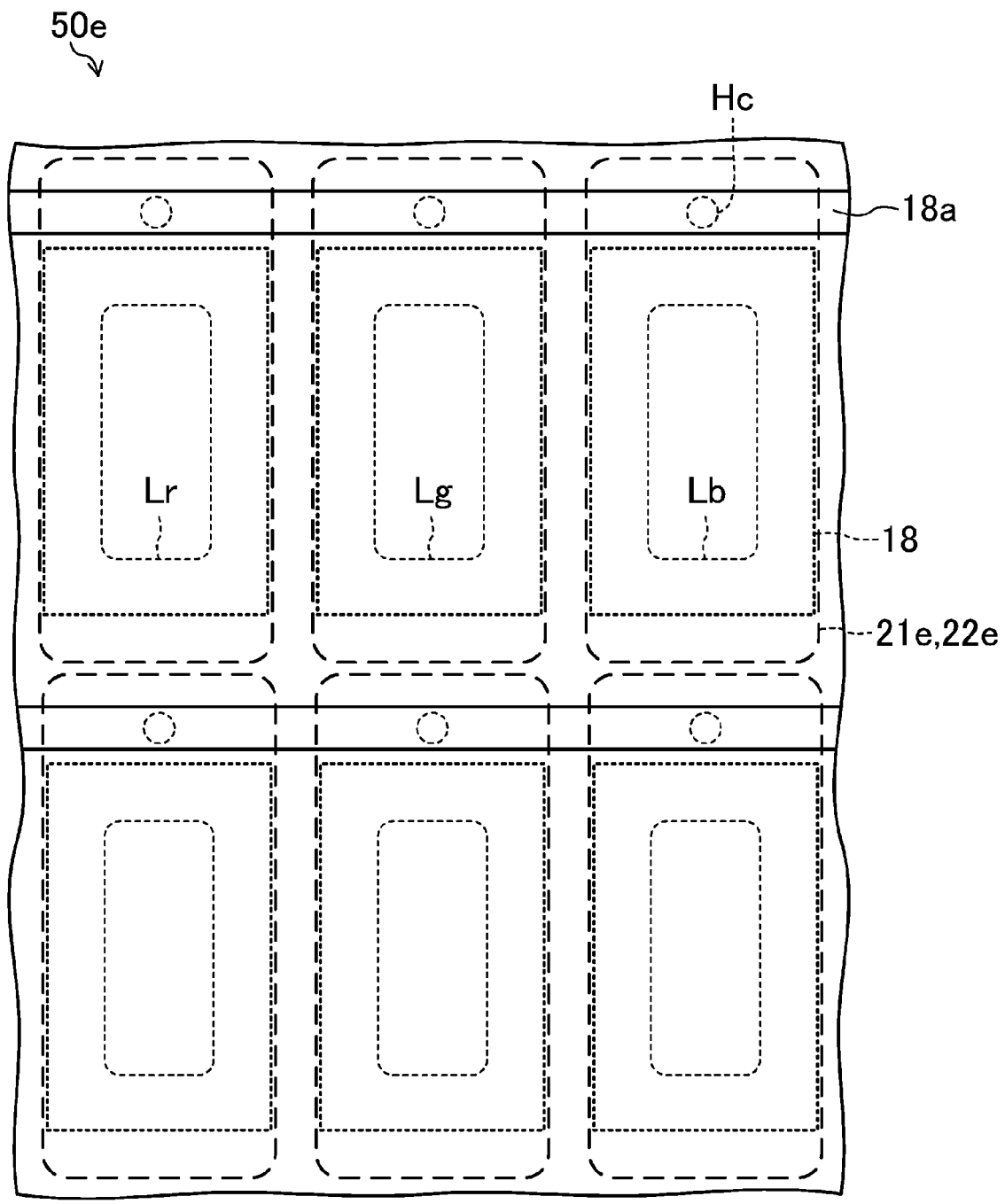
FIG. 13 is a plan view illustrating a connection structure for second electrodes in a modification of the organic EL display device according to the fourth embodiment of the disclosure.

FIGS. 11 to 13 each illustrate a fourth embodiment of an organic EL display device according to the disclosure. Here, FIG. 11 is a plan view illustrating an arrangement structure for sealing films 22d in an organic EL display device 50d of the present embodiment. Moreover, FIG. 12 is a plan view illustrating a connection structure for second electrodes 21d in the organic EL display device 50d. Moreover, FIG. 13 is a plan view illustrating a connection structure for second electrodes 22e in an organic EL display device 50e of a modification of the organic EL display device 50d.

The first to third embodiments describe the examples in which the organic EL display devices 50a, 50b and 50c include the plurality of sealing films 22a, 22b and 22c provided to extend parallel to one another, respectively. On the other hand, the present embodiment describes an example in which the organic EL display device 50d includes the plurality of sealing films 22d provided in a matrix form.

The organic EL display device 50d includes a base substrate 10, an organic EL element 8 provided on the base substrate 10 via a moisture-proof film 11 to interlayer insulating films 17, the plurality of sealing films 22d provided on the organic EL element 8, and a functional layer 40 provided on the plurality of sealing films 22d via an adhesive layer 30.

The organic EL element 8 includes a plurality of first electrodes 18, a plurality of edge covers 19, a plurality of organic EL layers 20 and a plurality of second electrodes 21d, which are provided in order on the interlayer insulating films 17. Here, as illustrated in FIG. 12, the plurality of second electrodes 21d are provided in a matrix form. Moreover, as illustrated in FIG. 12, the second electrodes 21d are each provided in a rectangular shape in plan view to overlap the organic EL layer 20 of corresponding one of sub pixels P. That is, the second electrodes 21d do not electrically connect the sub pixels P arranged adjacent to one another in a vertical direction in FIG. 12 and configured to perform gray scale display of the same color together. Moreover, the second electrodes 21d do not electrically connect the sub pixels P arranged adjacent to one another in a lateral direction in FIG. 12 and configured to perform gray scale display of different colors together. Moreover, as illustrated in FIG. 12, the second electrodes 21d are connected via a contact hole Hc formed in the edge covers 19 to a common wiring line 18a including the same material as the first electrode 18 and provided in the same layer as the first electrode 18. Here, the second electrode 21d functions to inject electrons into the organic EL layer 20, and includes the same material as the second electrode 21a described in the first embodiment. Note that the common wiring line 18a is provided to overlap a gate line 12a.

As illustrated in FIGS. 11 and 12, the plurality of sealing films 22d are provided in a matrix form. Moreover, as illustrated in FIGS. 11 and 12, the sealing films 22d are provided on the second electrodes 21d, and are each formed in a rectangular shape in plan view to cover an edge surface of the organic EL layer 20 of corresponding one of the sub pixels P. Moreover, as illustrated in FIG. 11, the plurality of sealing films 22d are provided with a groove C formed in a lattice form to run between adjacent ones of the sub pixels P. Moreover, the sealing films 22d function to protect the organic EL layers 20 from, for example, moisture and oxygen. Here, for example, the sealing films 22d each include a monolayer film of an inorganic material such as a silicon oxide film, a silicon nitride film and a silicon oxynitride film, or include a layered film of two or more of these films.

As with the organic EL display device 50a of the first embodiment, the organic EL display device 50d including the above-described configuration is configured to display an image by appropriately causing a light emitting layer 3 of the organic EL layer 20 to emit light in each of the sub pixels P.

The organic EL display device 50d of the present embodiment can be produced by the production method described in the first embodiment except that the pattern shapes used for forming the second electrodes 21a and the sealing films 22a are modified to form the second electrodes 21d and the sealing films 22d. Note that the present embodiment describes the example of the production method for the organic EL display device 50d in which the second electrodes 21d and the sealing films 22d are separately formed. However, second electrodes 21e and sealing films 22e may be formed in the same process to produce an organic EL display device 50e. Specifically, as with the production method described in the second embodiment, an electrically conductive film serving as the second electrodes 21e and an inorganic film serving as the sealing films 22e are formed entirely on a substrate on which the organic EL layers 20 are formed. Subsequently, the electrically conductive film and the inorganic film are patterned by etching with a buffered hydrofluoric acid to form the second electrodes 21e and the sealing films 22e. Next, a barrier film is formed by ALD to cover the sealing films 22d. Note that not only the second electrodes 21e and the sealing films 22e but also the organic EL layers 20 may be formed by etching with a buffered hydrofluoric acid, and perimeter edge surfaces of the plurality of organic EL layers 20 may each be flush with a perimeter edge surface of corresponding one of the plurality of sealing films 22e separated from one another.

As describe above, according to the organic EL display device 50d of the present embodiment, the above-described effect (1) can be obtained.

The effect (1) is as follow in detail. Since the sealing films 22d are provided with the groove C formed in a lattice form to run between adjacent ones of the plurality of sub pixels P, rigidity of the organic EL display device 50d relatively decreases in portions which are located between adjacent ones of the plurality of sub pixels P and in which the groove C is formed. Therefore, when the organic EL display device 50d is bent about a bending axis parallel to the gate line 12a or a data line 15a, in the organic EL display device 50d, a large bending strain is generated in portions which are located outside of the sub pixels P and in which the groove C is formed, and a small bending strain is generated in portions which are located inside of the sub pixels P and in which no groove C is formed. As a result, since a strain in the sealing films 22d reduces, occurrence of cracking can be suppressed in the sealing films 22d. Accordingly, occurrence of cracking in the sealing films 22d at the time of bending the organic EL display device 50d can be suppressed. Further, since occurrence of cracking in the sealing films 22d can be suppressed, sealing performance of the sealing films 22d improves, and reliability of the organic EL display device 50d can be improved.

Fifth Embodiment

Figure 14:
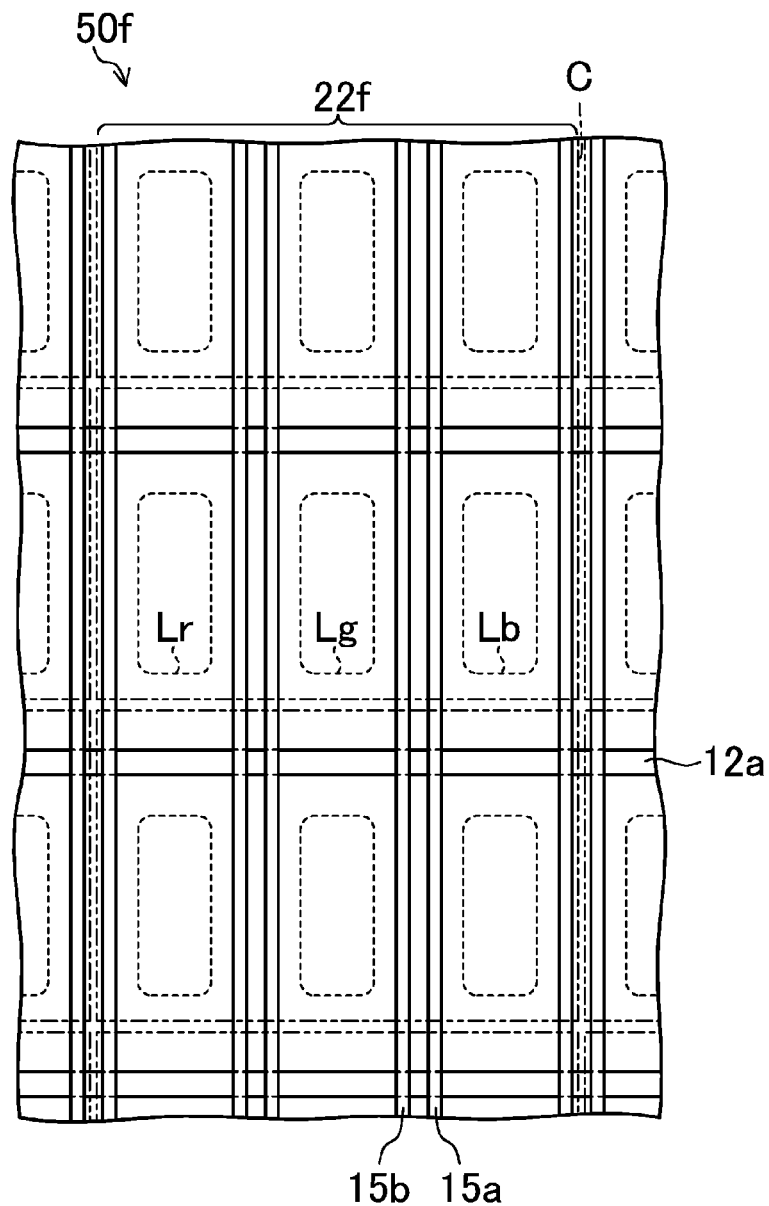
FIG. 14 is a plan view illustrating an arrangement structure for sealing films in an organic EL display device according to a fifth embodiment of the disclosure.
Figure 15:
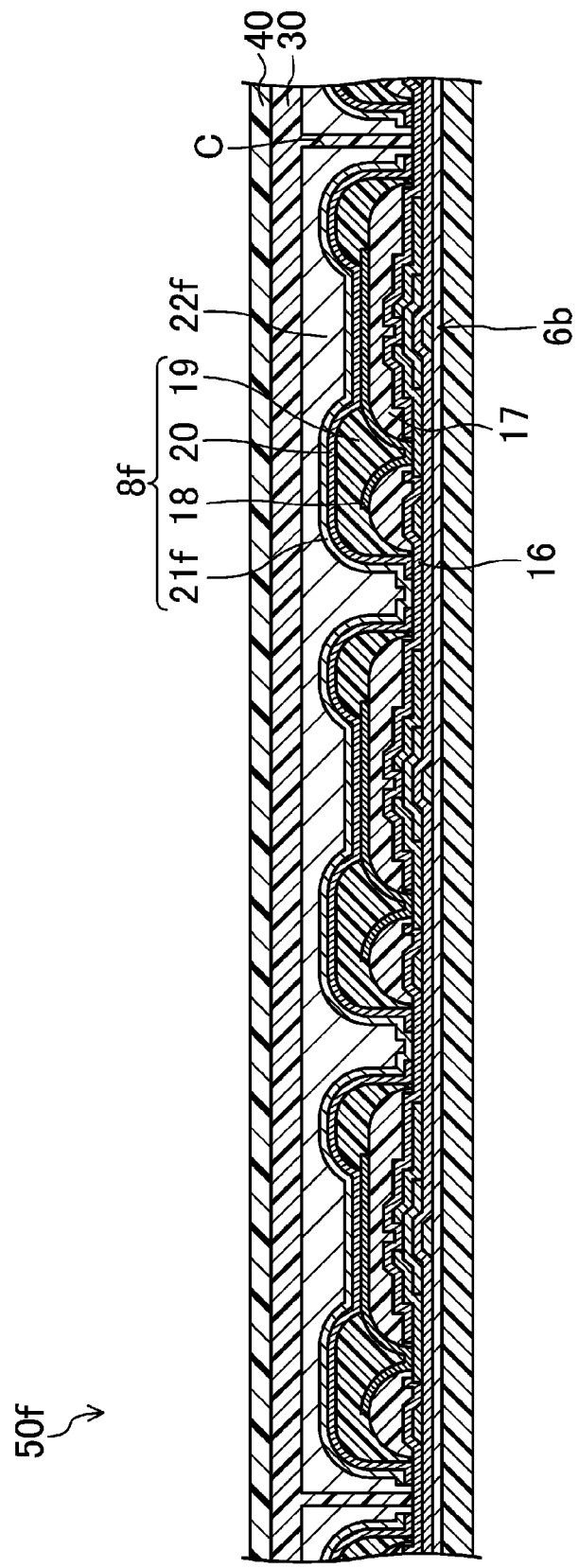
FIG. 15 is a cross-sectional view of the organic EL display device according to the fifth embodiment of the disclosure, and corresponds to FIG. 4.
Figure 16:
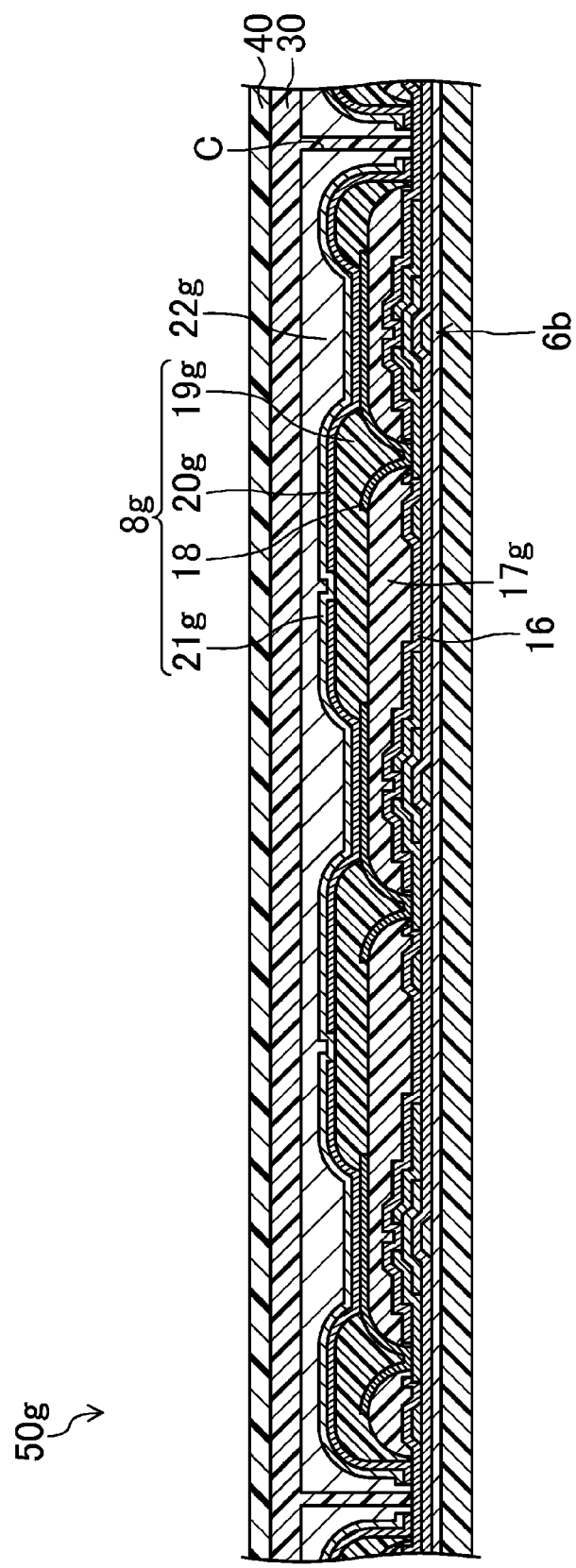
FIG. 16 is a cross-sectional view of a modification of the organic EL display device according to the fifth embodiment of the disclosure, and corresponds to FIG. 4.

FIGS. 14 to 16 each illustrate a fifth embodiment of an organic EL display device according to the disclosure. Here, FIG. 14 is a plan view illustrating an arrangement structure for sealing films 22f in an organic EL display device 50f of the present embodiment. Moreover, FIG. 15 is a cross-sectional view of the organic EL display device 50f, and corresponds to FIG. 4. Moreover, FIG. 16 is a cross-sectional view of an organic EL display device 50g of a modification of the organic EL display device 50f, and corresponds to FIG. 4.

The fourth embodiment describes the example in which the organic EL display device 50d includes the sealing films 22d each provided in corresponding one of the sub pixels P. On the other hand, the present embodiment describes an example in which the organic EL display device 50f includes the sealing films 22f each provided in corresponding three adjacent ones of sub pixels P. Note that the present embodiment describes the example in which the organic EL display device 50f includes three adjacent sub pixels P constituting one pixel and the sealing films 22f are each provided in corresponding one of the pixels; however, four or more adjacent sub pixels P may constitute one pixel and the sealing films may each be provided in corresponding one of the pixels.

As illustrated in FIG. 15, the organic EL display device 50f includes a base substrate 10, an organic EL element 8f provided on the base substrate 10 via a moisture-proof film 11 to interlayer insulating films 17, the plurality of sealing films 22f provided on the organic EL element 8f, and a functional layer 40 provided on the plurality of sealing films 22f via an adhesive layer 30.

As illustrated in FIG. 15, the organic EL element 8f includes a plurality of first electrodes 18, a plurality of edge covers 19, a plurality of organic EL layers 20 and a plurality of second electrodes 21f, which are provided in order on the interlayer insulating films 17. Here, the plurality of second electrodes 21f are provided to extend parallel to one another in a vertical direction in FIG. 14. Moreover, the second electrodes 21f are each provided in an elongated rectangular shape in plan view to overlap the organic EL layers 20 of all the sub pixels P, all the sub pixels P being arranged in one row in the vertical direction in FIG. 14, in corresponding three rows that are adjacent to one another in a lateral direction in FIG. 14. Note that as illustrated in FIG. 15, the second electrodes 21f are each provided to cover edge surfaces of the organic EL layers 20 disposed inside among the organic EL layers 20 of all the sub pixels P in the three adjacent rows. Moreover, in a non-display region, the second electrodes 21f are connected via a contact hole formed in a layered film of a gate insulating film 13 and of a passivation film 16 to a common wiring line including the same material as a gate line 12a and provided in the same layer as the gate line 12a. Note that the second electrode 21f functions to inject electrons into the organic EL layer 20, and includes the same material as the second electrode 21a described in the first embodiment.

As illustrated in FIG. 14, the plurality of sealing films 22f are provided to extend parallel to one another in the lateral direction in FIG. 14. Moreover, as illustrated in FIGS. 14 and 15, the sealing films 22f are each provided in an elongated rectangular shape in plan view to cover the second electrodes 21f and edge surfaces of the organic EL layers 20 that are exposed out of the second electrodes 21f. Moreover, as illustrated in FIGS. 14 and 15, the plurality of sealing films 22f are provided with grooves C each formed to extend in the vertical direction in FIG. 14 and to run between corresponding adjacent ones of the sub pixels P. Moreover, the sealing films 22f function to protect the organic EL layers 20 from, for example, moisture and oxygen. Here, for example, the sealing films 22f each include a monolayer film of an inorganic material such as a silicon oxide film, a silicon nitride film and a silicon oxynitride film, or include a layered film of two or more of these films.

As with the organic EL display device 50a of the first embodiment, the organic EL display device 50f including the above-described configuration is configured to display an image by appropriately causing a light emitting layer 3 of the organic EL layer 20 to emit light in each of the sub pixels P.

The organic EL display device 50f of the present embodiment can be produced by the production method described in the first embodiment except that the pattern shapes used for forming the second electrodes 21a and the sealing films 22a are modified to form the second electrodes 21f and the sealing films 22f.

Note that the present embodiment describes the example in which the organic EL display device 50f includes the interlayer insulating films 17 separated from one another and the edge covers 19 separated from one another in such a manner as to correspond to the respective sub pixels P adjacent in a direction in which the gate line 12a extends; however, the present embodiment may include an organic EL display device 50g in which edge covers 19g are separated from one another in such a manner as to correspond to the respective sets of three sub pixels P adjacent in a direction in which a gate line 12a extends.

Specifically, as illustrated in FIG. 16, the organic EL display device 50g includes a base substrate 10, an organic EL element 8g provided on the base substrate 10 via a moisture-proof film 11 to interlayer insulating films 17g, a plurality of sealing films 22g provided on the organic EL element 8g, and a functional layer 40 provided on the plurality of sealing films 22g via an adhesive layer 30.

As illustrated in FIG. 16, the organic EL element 8g includes a plurality of first electrodes 18, the plurality of edge covers 19g, a plurality of organic EL layers 20g, and a plurality of second electrodes 21g, which are provided in order on the plurality of interlayer insulating films 17g.

As illustrated in FIG. 16, the plurality of interlayer insulating films 17g are provided on a passivation film 16 and are, for example, formed to extend parallel to one another in the vertical direction in FIG. 14. Moreover, for example, the interlayer insulating films 17g are each provided in an elongated rectangular shape in plan view to overlap all the sub pixels P, all the sub pixels P being arranged in one row in the vertical direction in FIG. 14, in corresponding three rows that are adjacent to one another in the lateral direction in FIG. 14. Moreover, the interlayer insulating films 17g include, for example, a transparent organic resin material such as an acrylic resin.

The plurality of edge covers 19g are, for example, provided to extend parallel to one another in the vertical direction in FIG. 14. Moreover, as illustrated in FIG. 16, for example, the edge covers 19g are each provided in a lattice form of n rows (n is the number of the gate lines 12a)× three columns to cover end edges of the first electrodes 18 of all the sub pixels P, all the sub pixels P being arranged in one row in the vertical direction in FIG. 14, in corresponding three rows that are adjacent to one another in the lateral direction in FIG. 14. Here, an example of a material constituting the edge cover 19g includes an inorganic film such as silicon oxide ($SiO_2$), silicon nitride (SiNx (x is a positive number)) such as trisilicon tetranitride ($Si_3N_4$) and silicon oxynitride (SiON), or an organic film such as a (photosensitive) polyimide resin, a (photosensitive) acrylic resin, a (photosensitive) polysiloxane resin and a novolak resin.

The plurality of organic EL layers 20g are provided in the respective sub pixels P, and are arranged in a matrix form on the first electrodes 18 and the edge covers 19g. Moreover, in each of the sub pixels P, the organic EL layer 20g is provided to cover portions of the first electrode 18 that are exposed out of the edge cover 19g. Here, as with the organic EL layer 20 described in the first embodiment, the organic EL layer 20g includes a hole injecting layer 1, a hole transport layer 2, a light emitting layer 3, an electron transport layer 4 and an electron injecting layer 5, which are provided in order on the first electrode 18.

The plurality of second electrodes 21g are, for example, provided to extend parallel to one another in the vertical direction in FIG. 14. Moreover, for example, the second electrodes 21g are each provided in an elongated rectangular shape in plan view to overlap the organic EL layers 20g of all the sub pixels P, all the sub pixels P being arranged in one row in the vertical direction in FIG. 14, in corresponding three rows that are adjacent to one another in the lateral direction in FIG. 14. Note that as illustrated in FIG. 16, the second electrodes 21g are each provided to cover edge surfaces of the organic EL layers 20 disposed inside among the organic EL layers 20g of all the sub pixels P in the three adjacent rows. Moreover, in a non-display region, the second electrodes 21g are connected via a contact hole formed in a layered film of a gate insulating film 13 and of the passivation film 16 to a common wiring line including the same material as the gate line 12a and provided in the same layer as the gate line 12a. Note that the second electrode 21g functions to inject electrons into the organic EL layer 20g, and includes the same material as the second electrode 21a described in the first embodiment.

The plurality of sealing films 22g are, for example, provided to extend parallel to one another in the vertical direction in FIG. 14. Moreover, as illustrated in FIGS. 14 and 16, the sealing films 22g are each provided in an elongated rectangular shape in plan view to cover the second electrode 21g and edge surfaces of the organic EL layers 20g that are exposed out of the second electrodes 21g. Moreover, as illustrated in FIG. 16, the plurality of sealing films 22g are, for example, provided with grooves C each formed to extend in the vertical direction in FIG. 14 and to run between corresponding adjacent ones of the sub pixels P. Moreover, the sealing films 22g function to protect the organic EL layers 20g from, for example, moisture and oxygen. Here, for example, the sealing films 22g each include a monolayer film of an inorganic material such as a silicon oxide film, a silicon nitride film and a silicon oxynitride film, or include a layered film of two or more of these films.

As described above, according to the organic EL display devices 50f and 50g of the present embodiment, the above-described effect (1) can be obtained.

The effect (1) is as follow in detail. Since the sealing films 22f and 22g are provided with the grooves C each formed in a lattice form to run between corresponding adjacent ones of the plurality of sub pixels P, rigidity of the organic EL display devices 50f and 50g relatively decreases in portions which are located between corresponding adjacent ones of the plurality of sub pixels P and in which the grooves C are formed. Therefore, when the organic EL display devices 50f and 50g are each bent about a bending axis parallel to the gate line 12a or the data line 15a, in each of the organic EL display devices 50f and 50g, a large bending strain is generated in portions which are located outside of the sub pixels P and in which the grooves C are formed, and a small bending strain is generated in portions which are located inside of the sub pixels P and in which no groove C is formed. As a result, since strains in the sealing films 22f and 22g reduce, occurrence of cracking can be suppressed in the sealing films 22f and 22g. Accordingly, occurrence of cracking in the sealing films 22f and 22g at the time of bending the organic EL display device 50f and 50g can be suppressed. Further, since occurrence of cracking in the sealing films 22f and 22g can be suppressed, sealing performance of the sealing films 22f and 22g improves, and reliability of the organic EL display devices 50f and 50g can be improved.

Other Embodiments

The above-described embodiments each describe the example in which the organic EL display device includes the sealing films provided with grooves passing through in the thickness direction. However, the disclosure is also applicable to an organic EL display device including sealing films provided with grooves not passing through in the thickness direction.

Moreover, the embodiments each describe the example in which the organic EL display device includes the sealing films patterned by removing the inorganic film serving as the sealing films in portions between adjacent ones of the sub pixels. However, to improve flexibility of the organic EL display device, not only the sealing films but also the pattern moisture-proof films and the gate insulating films may be patterned by partially removing the inorganic films serving as the moisture-proof films and the gate insulating films in portions between adjacent ones of the sub pixels.

Moreover, the above-described embodiments each describe the example in which the organic EL layer includes the five-layer layered structure including the hole injecting layer, the hole transport layer, the light emitting layer, the electron transport layer and the electron injecting layer. However, for example, the organic EL layer may include a three-layer layered structure including a hole injection-cum-transport layer, a light emitting layer and an electron transport-cum-injection layer.

Moreover, the above-described embodiments each describe the example in which the organic EL display device includes the first electrode serving as a positive electrode and the second electrode serving as a negative electrode. However, the disclosure is also applicable to an organic EL display device in which a layered structure of organic EL layers is in the reverse order, with a first electrode serving as a negative electrode and a second electrode serving as a positive electrode.

Moreover, the above-described embodiments each describe the example in which the organic EL display device includes the element substrate in which the electrode of the TFT connected to the first electrode serves as the drain electrode. However, the disclosure is also applicable to an organic EL display device including an element substrate in which an electrode of a TFT connected to a first electrode is referred to as a source electrode.

INDUSTRIAL APPLICABILITY

As described above, the disclosure is useful for a flexible organic EL display device.

REFERENCE SIGNS LIST

C Groove
P Sub pixel
8 Organic EL element
10 Base substrate
12c, 15e, 18a Common wiring line
20, 20g Organic EL layer
21a, 21c to 21g Second electrode (negative electrode)
22a to 22g Sealing film
23 Inorganic barrier film
50a to 50g Organic EL display device

The invention claimed is:

1. An organic EL display device comprising:
a base substrate;
a source electrode on the base substrate;
a passivation film on the source electrode;
an interlayer insulating film on the passivation film;
a plurality of organic EL elements provided on the base substrate and each including a plurality of organic EL layers arranged in a matrix;
a plurality of sealing films provided on the plurality of organic EL elements; and
a plurality of sub pixels defined corresponding to the plurality of organic EL layers, wherein
each of the plurality of organic EL elements includes a first electrode, an edge cover, and a second electrode,
each of the plurality of organic EL layers covers a corresponding one of the first electrodes that is exposed out of a respective one of the edge covers,
each of the plurality of sealing films is divided between adjacent ones of the plurality of sub pixels,
the passivation film includes a silicon oxide film, a silicon nitride film, or a silicon oxynitride film,
the interlayer insulating film includes a resin material,
the plurality of sealing films include inorganic films, and
one of the plurality of sealing films is in contact with the passivation film, so that one of the plurality of sealing films and the passivation film seals one of the plurality of organic EL elements.

2. The organic EL display device according to claim 1, wherein the plurality of sealing films are divided in a lattice form.

3. The organic EL display device according to claim 1, wherein the plurality of sealing films extend parallel to one another.

4. The organic EL display device according to claim 1, wherein
the plurality of organic EL elements includes a plurality of negative electrodes provided on each of the plurality of organic EL layers,
each of the plurality of negative electrodes is separated from one another corresponding to each of the plurality of sealing films, and each of the plurality of negative electrodes is connected to a common wiring line.

5. The organic EL display device according to claim 4, wherein
a plurality of gate lines are provided to extend parallel to one another, and
the plurality of negative electrodes are each provided in an elongated rectangular shape in plan view, each overlapping with the organic EL layers corresponding to all the sub pixels, of the plurality of sub pixels, arranged in one row in a direction in which the plurality of gate lines extend.

6. The organic EL display device according to claim 4, wherein
a plurality of gate lines are provided to extend parallel to one another, and
the plurality of negative electrodes are each provided in an elongated rectangular shape in plan view, each overlapping with the organic EL layers corresponding to all the sub pixels, of the plurality of sub pixels, arranged in one row in a direction orthogonal to the plurality of gate lines.

7. The organic EL display device according to claim 1, wherein the plurality of sealing films are each provided covering a perimeter edge surface of at least a corresponding one of the plurality of organic EL layers.

8. The organic EL display device according to claim 1, wherein
a perimeter edge surface of each of the plurality of sealing films at least partially overlaps with a perimeter edge surface of at least corresponding one of the plurality of organic EL layers, and
an inorganic barrier film is provided covering the plurality of sealing films.

9. The organic EL display device according to claim 8, wherein the perimeter edge surface of each of the plurality of sealing films overlaps with the perimeter edge surface of the at least corresponding one of the plurality of organic EL layers.

10. The organic EL display device according to claim 8, wherein the inorganic barrier film is in contact with the perimeter edge surface of each of the plurality of organic EL layers and the perimeter edge surface of each of the plurality of sealing films.

11. A method for producing the organic EL display device according to claim 8, the method comprising:
forming the inorganic barrier film by forming a film of aluminum oxide by atomic layer deposition to cover the plurality of sealing films.

12. The organic EL display device according to claim 3, wherein
the plurality of sub pixels include a plurality of first sub pixels having a first color and a plurality of second sub pixels having a second color which is different than the first color;
the plurality of the first sub pixels and the plurality of the second sub pixels extend parallel to one another;
one of the plurality of sealing films covers the plurality of first sub pixels and the plurality of second sub pixels respectively; and
another one of the plurality of sealing films is divided between the plurality of first sub pixels and the plurality of second sub pixels.

13. The organic EL display device according to claim 4, wherein
the plurality of sub pixels include a plurality of first sub pixels having a first color and a plurality of second sub pixels having a second color which is different than the first color;
the plurality of the first sub pixels and the plurality of the second sub pixels extend parallel to one another;
each of the plurality of negative electrodes covers the plurality of first sub pixels and the plurality of second sub pixels respectively; and
each of the plurality of negative electrodes is divided between the plurality of first sub pixels and the plurality of second sub pixels.

14. The organic EL display device according to claim 12, wherein
a plurality of gate lines are provided to extend parallel to one another,
a plurality of data lines are provided to extend parallel to one another and in a direction orthogonal to the plurality of gate lines,
one of the plurality of data lines corresponding to the plurality of the first sub pixels is provided inside the one of the plurality of sealing films in a plan view, and
one of the plurality of data lines corresponding to the plurality of the second sub pixels is provided inside the another one of the plurality of sealing films in the plan view.

15. The organic EL display device according to claim 12, wherein one of the plurality of gate lines crosses the one of the plurality of sealing films and the another one of the plurality of sealing films.

* * * * *